United States Patent
Nishijima

(10) Patent No.: US 7,915,759 B2
(45) Date of Patent: Mar. 29, 2011

(54) MICRO-POWER SOURCE MODULE

(75) Inventor: Kenichi Nishijima, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 387 days.

(21) Appl. No.: 12/222,240

(22) Filed: Aug. 5, 2008

(65) Prior Publication Data

US 2009/0051466 A1   Feb. 26, 2009

(30) Foreign Application Priority Data

Aug. 6, 2007   (JP) ................. 2007-203730

(51) Int. Cl.
*H02J 1/10* (2006.01)
(52) U.S. Cl. .......................................... 307/43
(58) Field of Classification Search .......... 307/43, 307/105; 363/39; 333/81 R
See application file for complete search history.

(56) References Cited

U.S. PATENT DOCUMENTS

2009/0267704 A1 * 10/2009 Chang et al. .................. 333/175

FOREIGN PATENT DOCUMENTS

| JP | S62-124723 | 6/1987 |
| JP | 06-251996 | 9/1994 |
| JP | 11-111541 | 4/1999 |
| JP | 2004-072815 | 3/2004 |

* cited by examiner

*Primary Examiner* — Jared J Fureman
*Assistant Examiner* — Carlos Amaya
(74) *Attorney, Agent, or Firm* — Rabin & Berdo, P.C.

(57) ABSTRACT

A power source IC and noise absorption capacitors (decoupling capacitors) are formed on an inductor in such a manner that the noise absorption capacitors are provided on the input side and the output side, respectively. A micro-power source module can thus be provided which is small in occupied area and height and can reduce conduction noise due to ground lines.

19 Claims, 19 Drawing Sheets

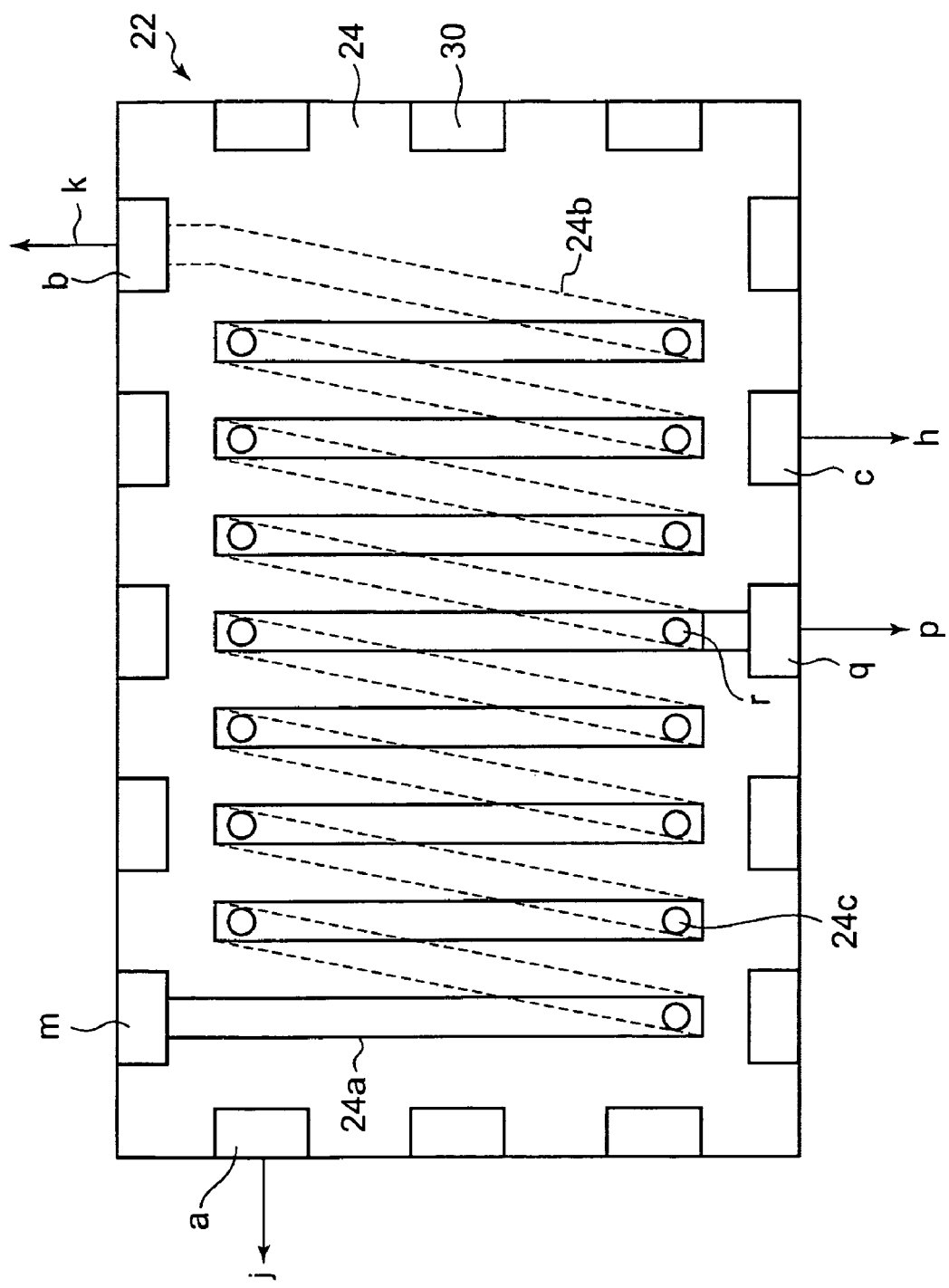

MICRO-POWER SOURCE MODULE

BACKGROUND OF THE INVENTION

1. Field of the Invention

The present invention relates to a micro-power source module, which is part of a micro-power source device used in portable devices, personal computers, etc.

2. Description of the Related Art

Multiple low-voltage supply power sources specific to an LSI (large scale integrated circuit) are mounted on a printed circuit board called a high-speed board in current electronic apparatus. It is desired that the space (area and height) occupied by the low-voltage supply power sources mounted on such a printed circuit board be made as small as possible. The low-voltage supply power sources (power source devices) specific to an LSI are called POL (point of load) power sources. Each of them is composed of discrete components such as a power source IC, an inductor, and capacitors and supplies power to the LSI as a load. The POL power sources are disposed close to the LSI and mounted on the same printed circuit board, as is the LSI. In many cases, one LSI mounted on a current printed circuit board requires two power sources (two voltage levels) or three power sources (three voltage levels), that is, two or three POL power sources. However, there are strict restrictions on space on printed circuit boards and it is difficult to dispose all of plural POL power sources close to an LSI. In particular, very strict restrictions are imposed on spaces for printed circuit boards of cell phones. Therefore, POL power sources to be mounted on a printed circuit board are required to occupy spaces that are as small as possible. In the case of cell phones, cell phone manufacturers not only require that the areas occupied by POL power sources be reduced, but also make a severe requirement that the height be less than 1 mm.

To meet such requirements, a micro-power source module has been developed in which a power IC and an inductor are integrated together. At present, the occupied area of a printed circuit board is reduced by mounting such a micro-power source module and input and output capacitors on the printed circuit board. FIGS. 14-16 show the configuration of a conventional POL power source. More specifically, FIGS. 14-16 are a circuit diagram, a layout diagram showing a layout on a printed circuit board, and a plan view of important parts of an inductor, respectively. A POL power source 203 (power source device) is composed of an input capacitor 1, an inductor 35, a power source IC 101, and an output capacitor 3. The power source IC 101 is mounted on the inductor 35. As shown in FIGS. 14 and 15, a high-potential-side interconnection of a power source 12 is connected to a high-potential-side input terminal 15. The input terminal 15 is connected to one terminal j of the input capacitor 1, which is connected to a high-potential-side input terminal d of the power source IC 101 via an external terminal a, which is formed in the inductor 35. A high-potential-side output terminal e of the power source IC 101 is connected to one terminal m of the inductor 35. The other terminal b of the inductor 35 is connected to one terminal k of the output capacitor 3, which is connected to a high-potential-side output terminal 17 of the POL power source 203. The output terminal 17 is connected to the high-potential side of a load 13.

The other terminal g of the input capacitor 1 is connected to a ground-side input terminal 16 of the POL power source 203. A ground terminal f of the power source IC 101 is connected to a connecting point h via a terminal c in the inductor 35. The other terminal i of the output capacitor 3 is connected, at a ground-side output terminal 18 of the POL power source 203, to a ground line 21 which is connected to a ground 14 of the power source 12. The portion of the ground line 21 between the input terminal 16 and the connecting point h is a first ground line 19, and the portion of the ground line 21 between the connecting point h and output terminal 18 is a second ground line 20. The input terminals 15 and 16, the output terminal 17 and 18, and the connecting point h are located on a printed circuit board 60. The inductances of the first ground line 19 and the second ground line 20 are a first GND inductance Lgnd1 and a second GND inductance Lgnd2, respectively. Symbols Lgnd1 and Lgnd2 are generically referred to as Lgnd. The power source IC 101 is composed of an on-MOSFET 6, an off-MOSFET 7, and a control circuit 8 for controlling them. The source of the on-MOSFET 6 is connected to the high-potential-side input terminal d of the power source IC 101. The drain of the on-MOSFET 6 and the drain of the off-MOSFET 7 are connected to the high-potential-side output terminal e of the power source IC 101. The source of the off-MOSFET 7 is connected to the ground terminal f of the power source IC 101.

The on-MOSFET 6 is a p-channel MOSFET and the off-MOSFET 7 is an n-channel MOSFET. The off-MOSFET 7 serves as a free wheel diode for returning a current flowing through the inductor 35. The POL power source 203 is a power source for the load 13 (e.g., an LSI) and is a low-voltage power source which outputs one voltage level. As shown in FIG. 16, in the inductor 35, a solenoid coil is formed in such a manner that a top coil pattern 24a and a bottom coil pattern 24b are formed on both sides of a ferrite substrate 24 and are connected to each other by connection conductors 24c through through-holes that are formed through the ferrite substrate 24. Terminals 30 are arranged along the periphery of the ferrite substrate 24; each terminal 30 is formed in such a manner that a front-side portion and a back-side portion are connected to each other on a side surface of the ferrite substrate 24. The two terminals m and b of the plural terminals 30 are connected to the two respective ends of the solenoid coil, and the terminals a and c are relay terminals for connecting the terminals d and f of the power source IC 101 to wiring patterns on the printed circuit board 60. JP-A-2004-72815 discloses a micro-power source module in which to reduce the occupied area of a POL power source a power source IC, an inductor, and capacitors are formed in three lamination layers. POL power sources are required not only to be small in occupied space as described above but also to exhibit low-noise performance. POL power sources output a low voltage, which directly affects whether an S/N ratio that is required by an LSI as a load (low voltage/high frequency) is satisfied. Therefore, POL power sources are strongly required to exhibit low-noise performance.

JP-A-62-124723 relates to a T-type filter that is known to be generally able to attain larger attenuation than a combination of an independent inductor and capacitor. Inductance elements are connected to both ends of a lead wire and a capacitor is connected to the lead wire. This publication states that because of this structure two adjoining inductors can be formed collectively and a T-type LC lowpass filter can easily be constructed by connecting a capacitor to one location. JP-A-6-251996 discloses an LC filter array which is constructed by sandwiching a lead frame between top and bottom ferrite blocks, inserting a chip capacitor into a through-hole that is formed through the bottom ferrite block so as to reach the lead frame, connecting one terminal electrode of the chip capacitor to the lead frame, and connecting the other terminal electrode to a common ground terminal provided on the bottom surface of the bottom ferrite block. This LC filter array is simple in structure, can be assembled easily, and has high productivity (i.e., suitable for mass production).

However, in the micro-power source module of JP-A-2004-72815 in which a power source IC, an inductor, and capacitors are formed in three lamination layers, the height is greater than 1 mm though the occupied area is small. Therefore, it is difficult to apply this module to uses such as cell phones in which the occupied height requirement is severe. In the conventional POL power source in which the input and output capacitors are provided on the printed circuit board, it is difficult to realize low-noise performance because of the GND inductance Lgnd which is formed by lines on the printed circuit board. Furthermore, it is difficult to employ the filters of JP-A-62-124723 and JP-A-6-251996 because they are too large in height and area for filters to be used in a micro-power source module. FIGS. 17 and 18 are graphs showing simulation results indicating that a difference in the GND inductance Lgnd on a printed circuit board results in different attenuation characteristics (differences in noise performance). FIG. 17 shows a simulation result of a case where Lgnd1=Lgnd2=1 nH, and FIG. 18 shows a simulation result of a case where Lgnd1=Lgnd2=3 nH. FIGS. 19A and 19B are equivalent circuit diagrams that were used for simulating the attenuation characteristics of FIGS. 17 and 18, and correspond to an on state and an off state, respectively.

The on state means a state in which power is supplied to the load 13 with the on-MOSFET 6 on and the off-MOSFET 7 off. The off state means a state in which power is supplied to the load 13 with the on-MOSFET 6 off and the off-MOSFET 7 on. High-frequency noise is generated when the MOSFETs 6 and 7 are switched on or off, and is propagated to the load 13 as conduction noise. The conduction noise is classified into on-time noise that is generated when power is supplied to the load 13 with the on-MOSFET 6 on and the off-MOSFET 7 off and off-time noise that is generated when power is supplied to the load 13 with the on-MOSFET 6 off and the off-MOSFET 7 on. FIG. 19A shows an equivalent circuit for an on-time simulation of the circuit of FIG. 14, that is, a circuit through which a current flows when the on-MOSFET 6 is on and the off-MOSFET 7 is off (the power source 12 is removed). More specifically, a noise generator 50 is inserted in place of the on-MOSFET 6 and the off-MOSFET 7 is removed, resulting in a circuit consisting of the inductor 35, the output capacitor 3, the second ground line 20, the first ground line 19, and the input capacitor 1. The noise generator 50 produces a noise-simulated high-frequency voltage and a voltage across the output capacitor 3 is simulated as an output voltage.

FIG. 19B shows an equivalent circuit for an off-time simulation of the circuit of FIG. 14, that is, a circuit through which a current flows when the on-MOSFET 6 is off and the off-MOSFET 7 is on. More specifically, a noise generator 50 is inserted in place of the off-MOSFET 7 and the on-MOSFET 6 is removed, resulting in a circuit consisting of the inductor 35, the output capacitor 3, and the second ground line 20. A voltage across the output capacitor 3 of the equivalent circuit is simulated. The noise generator 50 produces a high-frequency voltage in a frequency range of 1 to 1,000 MHz and a resulting high-frequency output voltage is simulated. The degree of reduction of a peak value of an output waveform with respect to a peak value of an input waveform, that is, (peak value of output waveform)/(peak value of input waveform) in dB, is employed as an attenuation amount. And frequency dependence of the attenuation amount is an attenuation characteristic. As the attenuation amount increases, it becomes harder for the conduction noise to be transmitted the load 13, which means better low-noise performance (reduction in output noise). The vertical axes of FIGS. 17 and 18 represent the off-time attenuation amount. As seen from FIGS. 17 and 18, the attenuation characteristic depends on the inductance (GND inductance) of the ground line 21. That is, as the GND inductance increases, the attenuation amount decreases and hence more conduction noise is transmitted from the output terminal 17 to the load 13 (LSI).

In common POL power sources, a set maker purchases plural discrete components such as a power source IC, an inductor, and input and output capacitors and arranges these discrete components on a wiring-patterned printed circuit board (layout/artwork wiring). Therefore, the GDN inductance, which is the inductance of the ground line 21, strongly depends on the wiring pattern of the printed circuit board used by the set maker. Even if power source circuits are identical on a circuit diagram, they may have very different attenuation characteristics if their wiring patterns for arrangement of the discrete components are different from each other. From the viewpoint of set makers, this is not convenient because the noise performance depends on the wiring pattern in the case where a power source IC, an inductor, and input and output capacitors are attached individually to a printed circuit board. Difficulty of use of discrete components is an obstruction to development of apparatus by set makers. Therefore, device makers are required to develop and supply devices (micro-power source modules) that are easy to use. From this viewpoint, the micro-power source module 202 of FIG. 15 in which the power source IC 101 and the inductor 35 are integrated together is easy to use for set makers in a sense that the number of components is small. However, in terms of noise performance, the micro-power source module 202 is not easy to use because the micro-power source module 202 and the input and output capacitors 1 and 3 are to be wired separately on the printed circuit board 60 and hence the GND inductance of the ground line 21 depends on the wiring pattern of the printed circuit board 60.

Therefore, the device maker that supplies the micro-power source module 202 is strongly required to reduce conduction noise that depends on the ground line 21 (i.e., to improve noise performance) while avoiding increase of the occupied space of the POL power source 203 and minimizing the cost increase. JP-A-2004-72815 discloses a micro-power source module in which ceramic capacitors, an inductor, and an IC chip are formed in lamination layers. This configuration is effective in attaining low-noise performance in that the GND inductance is less prone to be influenced by the wiring pattern of a printed circuit board and a shortest route of a high-frequency current in the module can be realized. However, this micro-power source module having the three-layer lamination structure is large in occupied height (more than 1 mm) and cannot satisfy the requirement of cell phone manufacturers. Furthermore, it is necessary to dispose the two ceramic capacitors (input and output capacitors) under the inductor and to arrange, along the entire peripheries of the capacitors, many external terminals for outputting signals to be transmitted to the printed circuit board. Therefore, this module is more difficult to manufacture than a module in which external terminals are formed in an inductor. On the other hand, although the T-type filter itself is a promising means for noise reduction, using, as a discrete component, the T-type filter as disclosed in JP-A-62-124723 or JP-A-6-251996 cannot solve the problems relating to the cost, the size, and the ground inductance Lgnd.

SUMMARY OF THE INVENTION

An object of the present invention is to provide a micro-power source module capable of solving the above problems, that is, capable of attaining low-noise performance at a low cost while reducing the occupied height and area.

To attain the above object, one aspect of the invention provides a micro-power source module comprising an inductor; a power source IC provided on the inductor; and one or plural capacitors provided on the inductor, for reducing noise, wherein the inductor has plural terminals and an intermediate tap and one of the plural terminals is connected to a ground terminal of the power source IC and a ground line that is disposed outside the inductor. It is preferable that the inductor be a divided inductor which is a divided solenoid coil, and at least one of the capacitors is an integrated capacitor that is connected to a dividing point of the divided inductor via the intermediate tap and is formed by a semiconductor process on the same semiconductor substrate as the power source IC is formed. In this case, a T-type filter is formed and the inductance of the divided inductor is set as large as the order of microhenries. As a result, the capacitance of the integrated capacitor for reducing noise can be made as small as the order of picofarads and can be formed on a semiconductor substrate by a semiconductor process. Since the height of the integrated capacitor is several micrometers at the most, the height of the micro-power source module can be made small. Another aspect of the invention provides a micro-power source module which is part of a micro-power source device comprising a high-potential-side device input terminal and a low-potential-side device input terminal that are connected to a high potential side of an external power source and a low potential side, connected to a ground, of the external power source, respectively; an input capacitor having one terminal that is connected to the high-potential-side device input terminal and the other terminal that is connected to the low-potential-side device input terminal; a power source IC having a high-potential-side input terminal that is connected to the one terminal of the input capacitor; an inductor having one terminal that is connected to a high-potential-side output terminal of the power source IC; an output capacitor having one terminal that is connected to the other terminal of the inductor; a high-potential-side device output terminal connected to the one terminal of the output capacitor; a low-potential-side device output terminal; and ground lines that connect the low-potential-side device input terminal to the other terminal of the input capacitor, connect the other terminal of the output capacitor to the low-potential-side device output terminal, and connect the low-potential-side device input terminal, a ground terminal of the power source IC, and the low-potential-side device output terminal to each other, the ground line extending between the low-potential-side device input terminal and a connecting point to which the ground terminal of the power source IC being a first ground line and the ground line extending between the connecting point and low-potential-side device output terminal being a second ground line, the micro-power source module comprising the inductor; the power source IC provided on the inductor and comprising an on-MOSFET, an off-MOSFET, and a control circuit for controlling the on-MOSFET and the off-MOSFET, wherein a drain of the on-MOSFET is connected to a drain of the off-MOSFET, a source of the on-MOSFET is connected to the high-potential-side input terminal of the power source IC, the drain of the on-MOSFET is connected to the high-potential-side output terminal of the power source IC, and a source of the off-MOSFET is connected to the ground terminal of the power source IC; and first and second noise absorption capacitors provided on the inductor adjacent to the power source IC, wherein the first noise absorption capacitor is connected between the source of the on-MOSFET and the source of the off-MOSFET via the first ground line, and the second noise absorption capacitor is connected between the other terminal of the inductor and the source of the off-MOSFET via the second ground line.

With this configuration, noise that reaches the output terminal can be reduced by forming the first and second noise absorption capacitors on the inductor and causing conduction noise to pass through these capacitors. Furthermore, since the capacitors are disposed beside the power source ICs to avoid a three-layer lamination structure of the capacitors, the inductor, and the power source IC, the height of the micro-power source module can be made small. Each of the first and second noise absorption capacitors may be a decoupling capacitor, which is a ceramic capacitor. In this case, a large capacitance can be obtained by a small volume. Still another aspect of the invention provides a micro-power source module which is part of a micro-power source device comprising a high-potential-side device input terminal and a low-potential-side device input terminal that are connected to a high potential side of an external power source and a low potential side, connected to a ground, of the external power source, respectively; an input capacitor having one terminal that is connected to the high-potential-side device input terminal and the other terminal that is connected to the low-potential-side device input terminal; a power source IC having a high-potential-side input terminal that is connected to the one terminal of the input capacitor; an inductor having one terminal that is connected to a high-potential-side output terminal of the power source IC; an output capacitor having one terminal that is connected to the other terminal of the inductor; a high-potential-side device output terminal connected to the one terminal of the output capacitor; a low-potential-side device output terminal; and ground lines that connect the low-potential-side device input terminal to the other terminal of the input capacitor, connect the other terminal of the output capacitor to the low-potential-side device output terminal, and connect the low-potential-side device input terminal, a ground terminal of the power source IC, and the low-potential-side device output terminal to each other, the ground line extending between the low-potential-side device input terminal and a connecting point to which the ground terminal of the power source IC being a first ground line and the ground line extending between the connecting point and low-potential-side device output terminal being a second ground line, the micro-power source module comprising the inductor being a divided inductor; the power source IC provided on the inductor and comprising an on-MOSFET, an off-MOSFET, and a control circuit for controlling the on-MOSFET and the off-MOSFET, wherein a drain of the on-MOSFET is connected to a drain of the off-MOSFET, a source of the on-MOSFET is connected to the high-potential-side input terminal of the power source IC, the drain of the on-MOSFET is connected to the high-potential-side output terminal of the power source IC, and a source of the off-MOSFET is connected to the ground terminal of the power source IC; and a noise absorption capacitor formed on the same semiconductor substrate as the power source IC is formed, wherein one terminal of the noise absorption capacitor is connected to a dividing point or an intermediate tap, connected to the dividing point, of the inductor and the other terminal of the noise absorption capacitor is connected to the source of the off-MOSFET.

With this configuration, the use of the divided capacitor makes it possible to form a noise filter that provides a great noise reducing effect even with a noise absorption capacitor whose capacitance is as small as the order of picofarads. Furthermore, since the above-described first and second nose absorption capacitor are replaced by the small, single noise absorption capacitor, the occupied area of the micro-power source module can be made small. In addition, since the height of the noise absorption capacitor is several micrometers at the most, almost no increase occurs in the height of the micro-power source module. A further aspect of the invention provides a micro-power source module which is part of a micro-power source device comprising a high-potential-side device input terminal connected to a high potential side of an external power source; an input capacitor having one terminal that is connected to the high-potential-side device input terminal; a power source IC having a high-potential-side input terminal that is connected to the one terminal of the input capacitor; an inductor having one terminal that is connected to a high-potential-side output terminal of the power source IC; an output capacitor having one terminal that is connected to the other terminal of the inductor; and a high-potential-side device output terminal connected to the one terminal of the output capacitor, the micro-power source module comprising: a low-potential-side device input/output terminal connected to the other terminal of the input capacitor, the other terminal of the output capacitor, and a low-potential side of a load; the inductor; the power source IC provided on the inductor and comprising an on-MOSFET, an off-MOSFET, and a control circuit for controlling the on-MOSFET and the off-MOSFET, wherein a drain of the on-MOSFET is connected to a drain of the off-MOSFET, a source of the on-MOSFET is connected to the high-potential-side input terminal of the power source IC, the drain of the on-MOSFET is connected to the high-potential-side output terminal of the power source IC, a source of the off-MOSFET is connected to the ground terminal of the power source IC, and the ground terminal of the power source IC is connected to the low-potential-side device input/output terminal; and the input and output capacitors provided-on the inductor adjacent to the power source IC.

With this configuration, influence of ground lines formed on a printed circuit board can be avoided and hence a noise reducing effect can be obtained. Furthermore, since the micro-power source device is formed on the inductor, it is convenient to use to set makers. And the micro-power source device can be miniaturized. This micro-power source module may be such that it further comprises a noise absorption capacitor formed on the same semiconductor substrate as the power source IC is formed, that the inductor is a divided inductor, that one terminal of the noise absorption capacitor is connected to a dividing point or an intermediate tap, connected to the dividing point, of the inductor, and that the other terminal of the noise absorption capacitor is connected to the source of the off-MOSFET. This measure enhances the noise reducing effect. It is preferable that the noise absorption capacitor be a decoupling capacitor that is smaller in capacitance than the above-mentioned ceramic capacitor. The noise absorption capacitor may be an integrated capacitor comprising an interlayer insulating film formed on the semiconductor substrate, a first polysilicon film formed on the interlayer insulating film, an insulating film formed on the first polysilicon film, and a second polysilicon film formed on the insulating film. This noise absorption capacitor can be formed easily by a semiconductor process. Where the insulating film is an oxide film, tan δ is small and hence ESR can be made small.

It is preferable that a division ratio K=L1/L2 be in a range of 1 to 9, where L1 is an inductance of a portion of the inductor from its one terminal to the dividing point and L2 is an inductance of the other portion of the inductor from the dividing point to the other terminal. A noise reducing effect is obtained in this range of K. The micro-power source module may be such that the on-MOSFET is a lateral p-channel MOSFET, the off-MOSFET is a lateral n-channel MOSFET, and each of the on-MOSFET and the off-MOSFET is a bidirectional MOSFET which allows a current to flow bidirectionally between the source and the drain when a gate receives an on signal. The off-MOSFET may be replaced by a diode having a cathode that is connected to the high-potential-side output terminal of the power source IC and an anode that is connected to the ground terminal of the power source IC.

According to the invention, a power source IC and noise absorption capacitors (decoupling capacitors) are formed on an inductor in such a manner that the noise absorption capacitors are disposed on the input side and the output side of the power source IC. A micro-power source module can thus be provided which has a small occupied area and height and can reduce conduction noise due to ground lines. A T-type filter is formed by connecting an integrated capacitor as a decoupling capacitor whose capacitance is on the order of picofarads to an intermediate tap of a divided inductor and forming the integrated capacitor on the surface of a power source IC chip. A micro-power source module can thus be provided which has a small occupied area and height and can reduce conduction noise due to ground lines. Mounting an input capacitor, an output capacitor, and a power source IC on an inductor makes the occupied area of a micro-power source device smaller than in a case that discrete components are mounted on a printed circuit board. The employment of a two-layer structure clears the severe occupied height requirement of cell phones. Furthermore, since the inductances of ground lines become extremely small, a micro-power source module can be provided which can reduce conduction noise. An input capacitor, an output capacitor, and a power source IC are mounted on a divided inductor, and an integrated capacitor whose capacitance is on the order of picofarads is connected to an intermediate tap of the divided inductor and is also mounted on the power source IC. A micro-power source module can thus be provided which has a small occupied area and height (also as a micro-power source device) and can reduce conduction noise due to ground lines.

BRIEF DESCRIPTION OF THE DRAWINGS

FIG. 7 is a detailed plan view of an inductor used in the micro-power source module of FIG. 6B;

DETAILED DESCRIPTION OF THE INVENTION

Figure 1A:
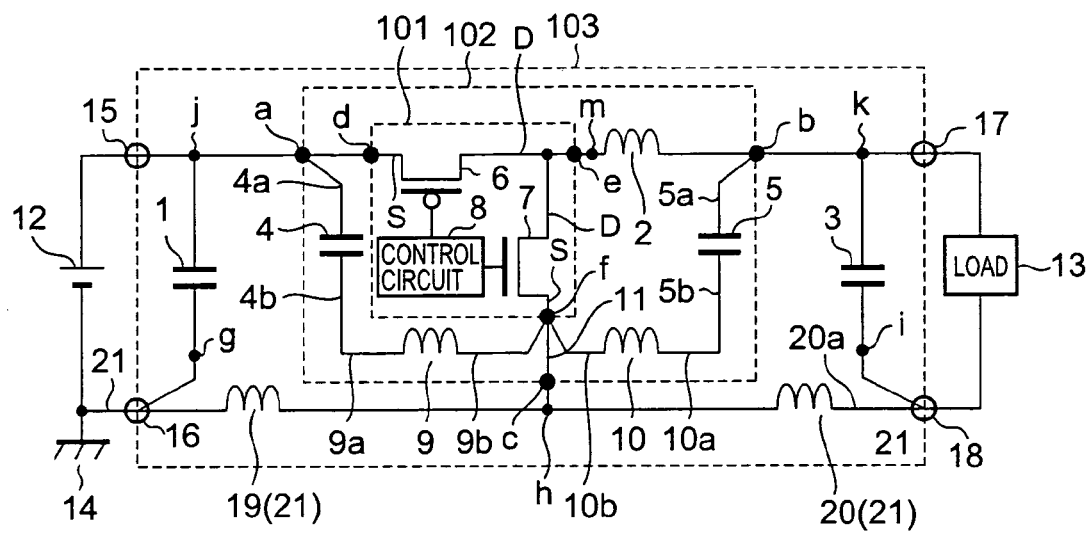
FIG. 1A is a circuit diagram of important parts of a micro-power source device according to a first embodiment of the invention.

Embodiments of the present invention will be hereinafter described. In the drawings to be referred to in the following description, components etc. having the same ones in the conventional POL power source 203 are given the same reference symbols as the latter.

Embodiment 1

Figure 1B:
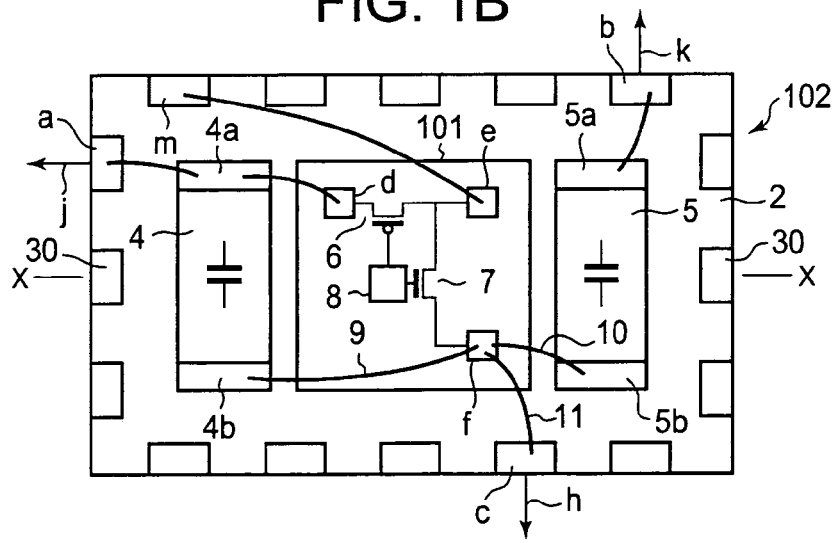
FIG. 1B is a plan view of important parts of a micro-power source module according to the first embodiment.
Figure 1C:
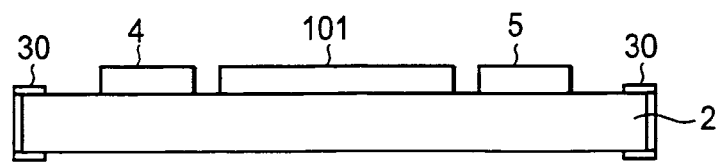
FIG. 1C is a sectional view taken along line X-X in FIG. 1B.

FIG. 1A is a circuit diagram of important parts of a micro-power source device according to a first embodiment of the invention. FIG. 1B is a plan view of important parts of a micro-power source module according to the first embodiment. FIG. 1C is a sectional view taken along line X-X in FIG. 1B. In FIG. 1A, a micro-power source device 103 (POL power source) is composed of an input capacitor 1, a power source IC 101, an inductor 2, an output capacitor 3, a first noise absorption capacitor 4, and a second noise absorption capacitor 5. A high-potential-side input terminal 15 of the micro-power source device 103, which is connected to a high-potential-side interconnection of an external power source 12, is connected to one terminal j of the input capacitor 1. A ground-side input terminal 16 of the micro-power source device 103, which is connected to a ground 14 of the power source 12, is connected to the other terminal g of the input capacitor 1. The one terminal j of the input capacitor 1 is connected to an external terminal a, which is formed in the inductor 2. The external terminal a is connected to a high-potential-side input terminal d of the power source IC 101 and one terminal 4a of the first noise absorption capacitor 4. A high-potential-side output terminal e of the power source IC 101 is connected to one terminal m of the inductor 2. The other terminal b of the inductor 2 is connected to one terminal k of the output capacitor 3 and one terminal 5a of the second noise absorption capacitor 5. The one terminal k of the output capacitor 3 is connected to a high-potential-side output terminal 17 of the micro-power source device 103. The output terminal 17 is connected to the high-potential side of a load 13. The other terminals 4b and 5b of the first and second noise absorption capacitors 4 and 5 are connected to a ground terminal f of the power source IC 101 by a first line 9 and a second line 10, respectively. The ground terminal f of the power source IC 101 is connected to a ground terminal c which is formed in the inductor 2 by a third line 11. The ground-side input terminal 16 of the micro-power source device 103 is connected, by a ground line 21 of a printed circuit board, to a ground-side output terminal 18 of the micro-power source device 103, which is connected to the low-potential side of the load 13. The ground line 21 is connected to a ground terminal c in the inductor 2 at a connecting point h. The other terminal i of the output capacitor 3 is connected to the low-potential-side output terminal 18 of the micro-power source device 103. The portion of the ground line 21 between the input terminal 16 and the connecting point h is a first ground line 19, and the portion of the ground line 21 between the connecting point h and output terminal 18 is a second ground line 20.

The power source IC 101 is composed of an on-MOSFET 6, an off-MOSFET 7, and a control circuit 8 for controlling them. The source S of the on-MOSFET 6 is connected to the input terminal d of the power source IC 101. The drain D of the on-MOSFET 6 and the drain D of the off-MOSFET 7 are connected to the output terminal e of the power source IC 101. The source S of the off-MOSFET 7 is connected to the ground terminal f of the power source IC 101. The first and second noise absorption capacitors 4 and 5, which are also called decoupling capacitors, are ceramic capacitors. The on-MOSFET 6 is a p-channel MOSFET and the off-MOSFET 7 is an n-channel MOSFET. Each of the on-MOSFET 6 and the off-MOSFET 7 is a lateral MOSFET and is also a bidirectional MOSFET which allows a current to flow bidirectionally between the source and the drain when the gate receives an on signal. In this embodiment, the side of the on-MOSFET 6 that is connected to the input capacitor 4 is called the source S and its side connected to the inductor 2 is called the drain D. The side of the off-MOSFET 7 that is connected to the inductor 2 is called the drain D and its side connected to the ground terminal f is called the source S. The off-MOSFET 7 serves as a free wheel diode for returning a current flowing through the inductor 2. When the gate receives an on signal, a return current flows from the source S to the drain D of the off-MOSFET 7. The off-MOSFET 7 may be replaced by a diode.

Figure 2:
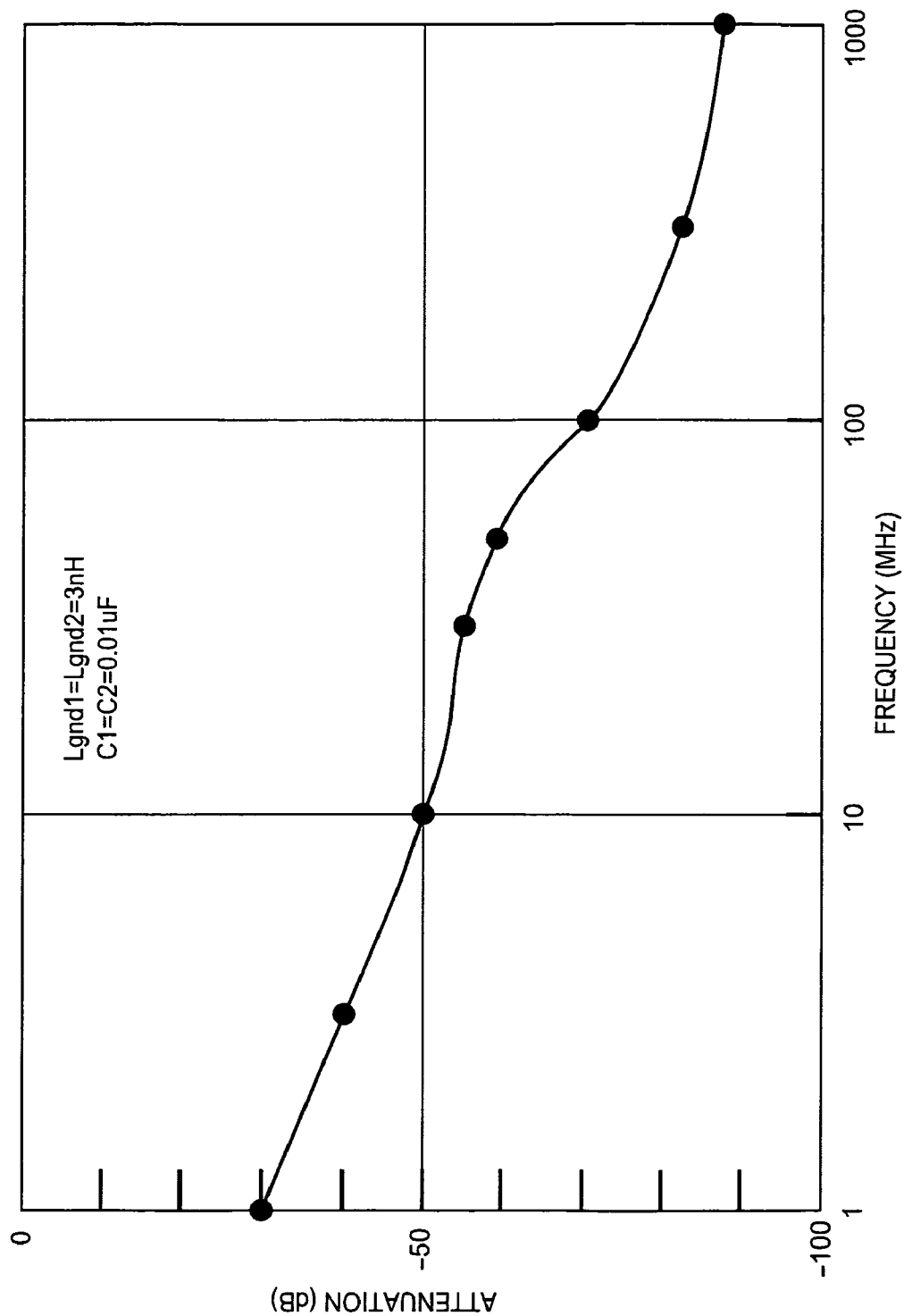
FIG. 2 is a graph showing an attenuation characteristic of the micro-power source device of FIGS. 1A-1D.
Figure 19A:
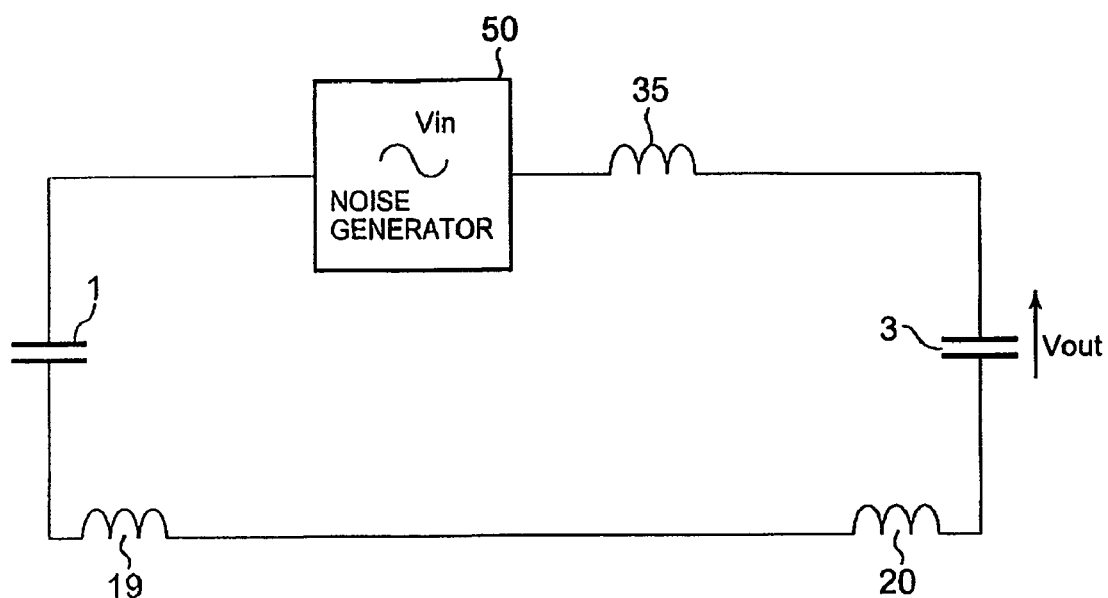
FIGS. 19A and 19B are equivalent circuit diagrams that were used for simulating the attenuation characteristics of FIGS. 17 and 18, and correspond to an on state and an off state, respectively.
Figure 19B:
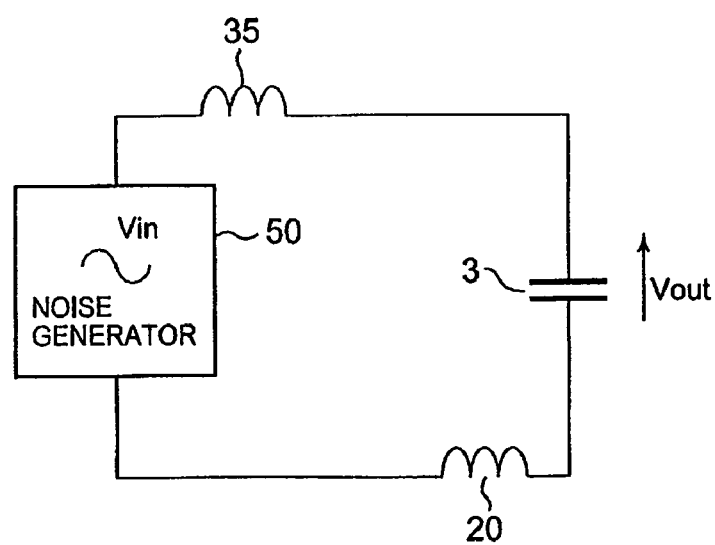

The micro-power source module 102 is composed of the inductor 2, the power source IC 101, the first and second noise absorption capacitors 4 and 5, the first line 9, and the second line 10. The inductance of the first ground line 19 is a first GND inductance Lgnd1 of several nanohenries and the inductance of the second ground line 20 is a second GND inductance Lgnd2 of several nanohenries. The inductance of the first line 9 is a first line inductance of about 0.1 nH and the inductance of the second line 10 is a second line inductance of about 0.1 nH. As shown in FIGS. 1B and 1C, the power source IC 101 and the first and second noise absorption capacitors 4 and 5 (located adjacent to the power source IC 101) are placed on and fastened to the inductor 2. The input capacitor 1, the inductor 2, and the output capacitor 3 are fastened to the printed circuit board (not shown). FIG. 2 is a graph showing an attenuation characteristic of the micro-power source device 103 of FIGS. 1A-1C. More specifically, FIG. 2 shows an attenuation characteristic of a case that the micro-power source module 102 incorporates the first and second noise absorption capacitors 4 and 5 which are ceramic capacitors having a capacitance 0.01 µF (indicated by symbols C1 and C2, respectively, in FIG. 2). The inductance of the inductor 2 is 2 µH. The inductances Lgnd1 and Lgnd2 of the first and second ground lines 9 and 10 are 3 nH. The vertical axis represents the off-time attenuation amount. A simulation was performed by adding a capacitor of 0.01 µF (as the second noise absorption capacitor 5) and an inductor of 0.1 nH (as the second line 10 having the second line inductance) to the circuit of FIG. 19B. Although not shown in any drawing, on-time attenuation amounts were also simulated. In this case, capacitors of 0.01 µF (as the first and second noise absorption capacitors 4 and 5) and inductors of 0.1 nH (as the first and second lines 9 and 10 having the first and second line inductances) were added to the circuit of FIG. 19A.

Figure 3:
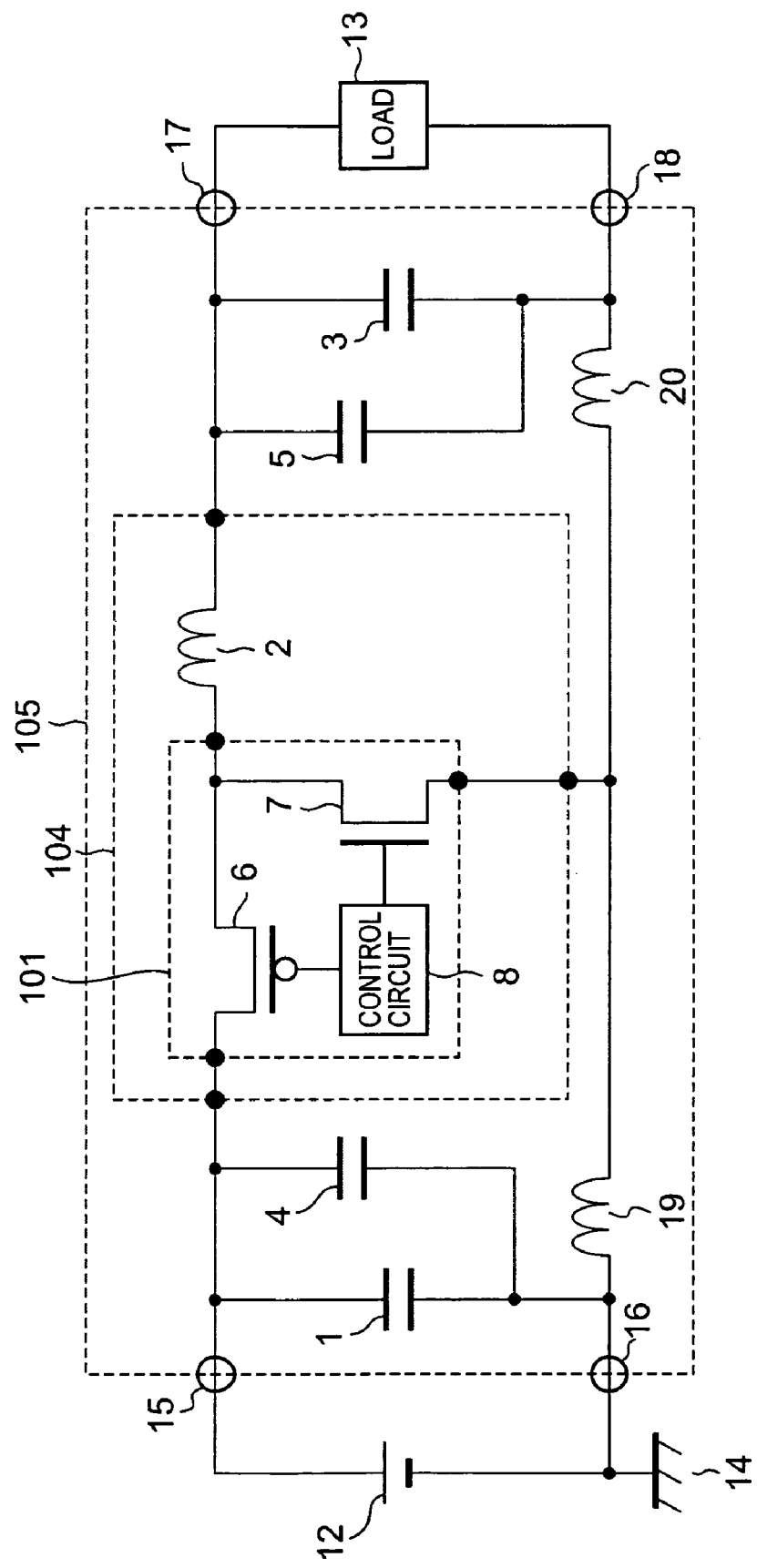
FIG. 3 is a circuit diagram of a micro-power source device in which first and second noise absorption capacitors are mounted on a printed circuit board outside a micro-power source module 104.
Figure 4:
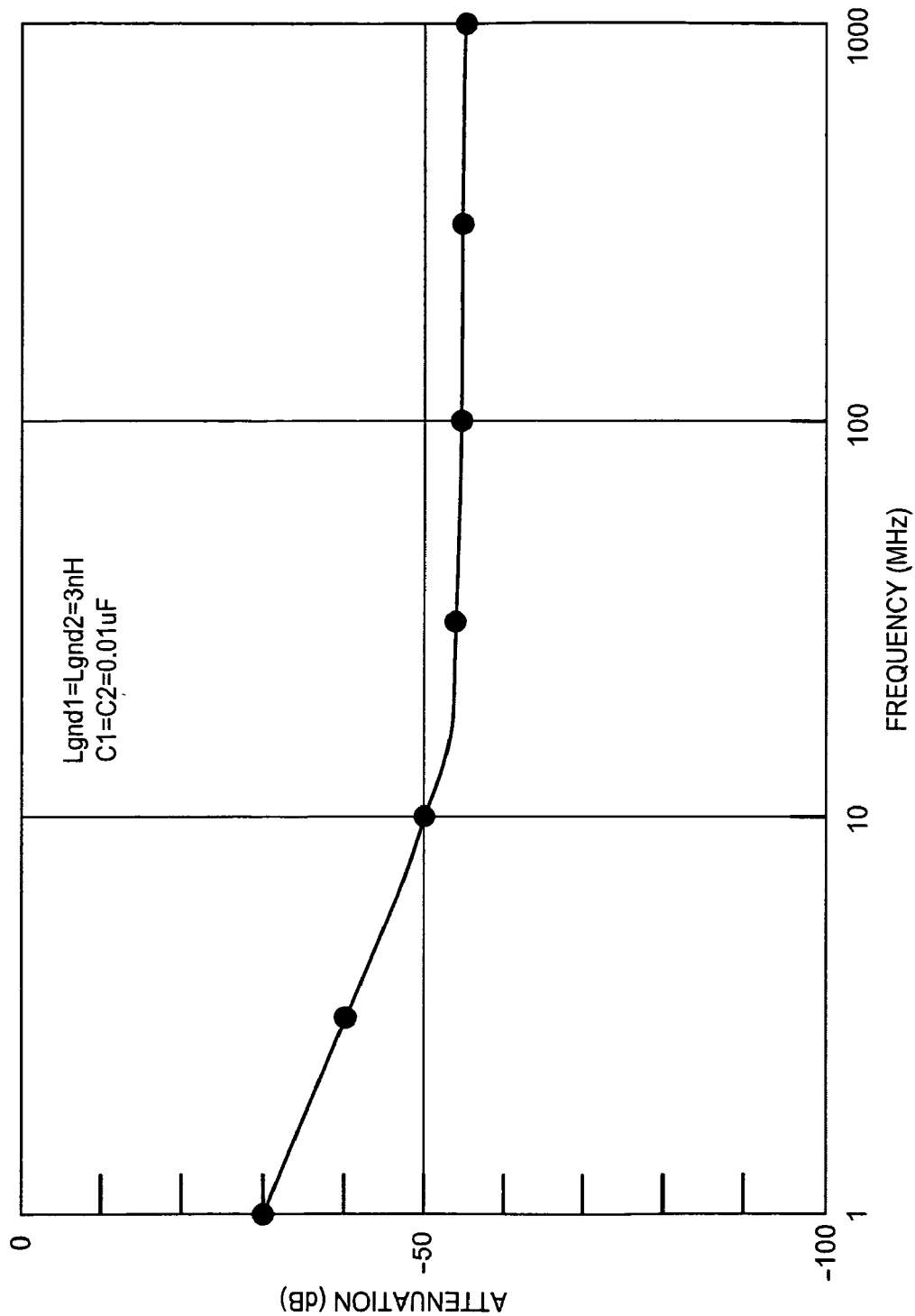
FIG. 4 is a graph showing an attenuation characteristic of a case that the first and second noise absorption capacitors 4 and 5 have a capacitance 0.01 μF in the circuit of FIG. 3.
Figure 5:
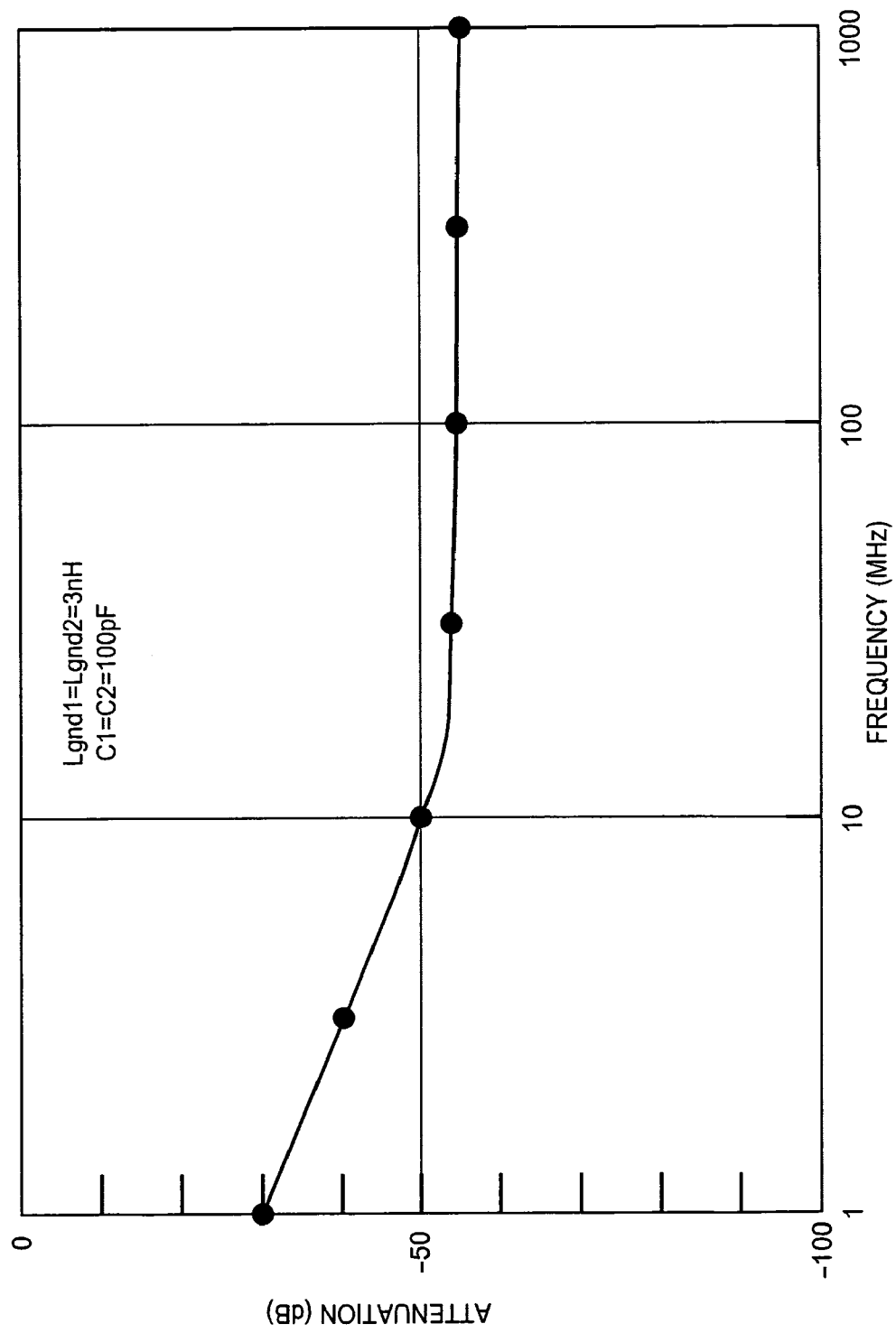
FIG. 5 is a graph showing an attenuation characteristic of a case that the first and second noise absorption capacitors 4 and 5 have a capacitance 100 pF in the circuit of FIG. 3.
Figure 18:
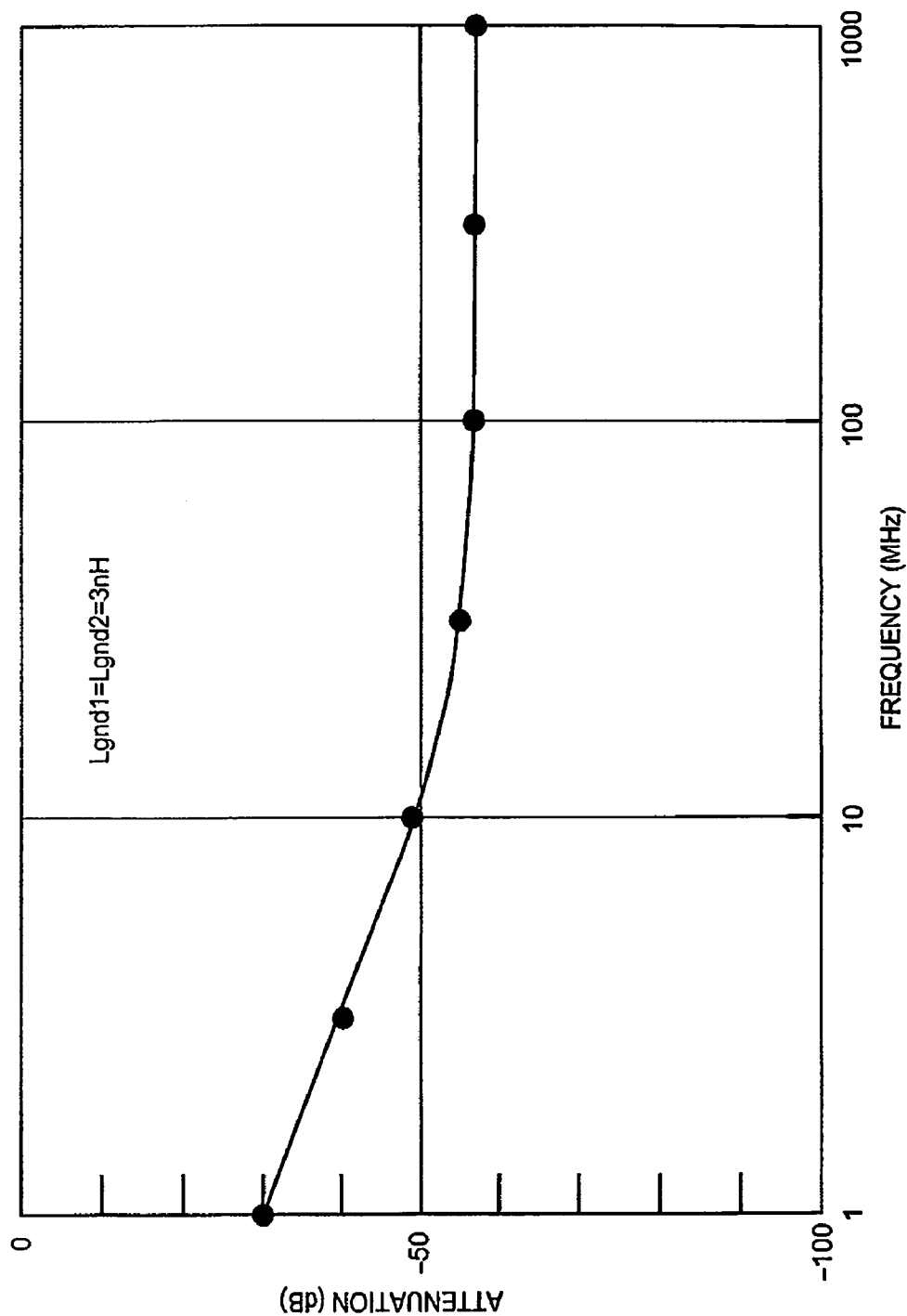
FIG. 18 is a graph showing an attenuation characteristic of a case that Lgnd1 and Lgnd2 of the POL power source of FIG. 14 are 3 nH.

It is seen from FIG. 2 that the attenuation characteristic is very different from and the low-noise performance is greatly improved from the case of FIG. 18 in which the micro-power source module 202 does not incorporate the first and second noise absorption capacitors 4 and 5. As shown in FIG. 4, the intended attenuation effect cannot be obtained in the case where as shown in FIG. 3 the first and second noise absorption capacitors 4 and 5 that are same ceramic capacitors of 0.01 µF as used in FIGS. 1A-1C are mounted on a printed circuit board (not shown) outside a micro-power source module 104. FIG. 4 shows a simulation result of an off-time attenuation characteristic of the circuit of FIG. 3. This attenuation characteristic is on the same level as the attenuation characteristic of FIG. 18. To obtain the intended attenuation effect, the first and second noise absorption capacitors 4 and 5 need to be incorporated in the micro-power source module 102 and have a relatively large capacitance on the order of 0.01 µF. As shown in FIG. 5, a small capacitance on the order of picofarads cannot provide sufficient noise reducing effect. FIG. 5 also shows a simulation result of an off-time attenuation characteristic of the circuit of FIG. 3 under the same simulation conditions as employed in the case of FIG. 4 except that C1=C2=100 pF. That is, where the noise absorption capacitors (decoupling capacitors) are incorporated in the micro-power source module 102 at the input and the output for the purpose of noise reduction, their capacitance needs to be on the order of 0.01 µF. Ceramic capacitors capable of realizing relatively large capacitances are effective in this respect. However, in the case of ceramic capacitors, their dielectric losses tan δ have serious influence.

Furthermore, where ceramic capacitors are used, since they are mounted on the inductor 2 separately form the power source IC 101, the number of mounting/assembling steps is increased and the occupied area of the inductor 2 is increased by the total area of the noise absorption capacitors 4 and 5. Next, a description will be made of a method capable of attaining a noise reducing effect with a capacitor having a small capacitance on the order of picofarads without increasing the number of mounting/assembling steps or the occupied area of the inductor 2. A ceramic capacitor having a small capacitance tends to be large in ESR (equivalent series resistance) and hence is not expected to provide a sufficient noise reducing effect. Therefore, a ceramic capacitor cannot be used as the following small-capacitance capacitor.

Embodiment 2

Figure 6A:
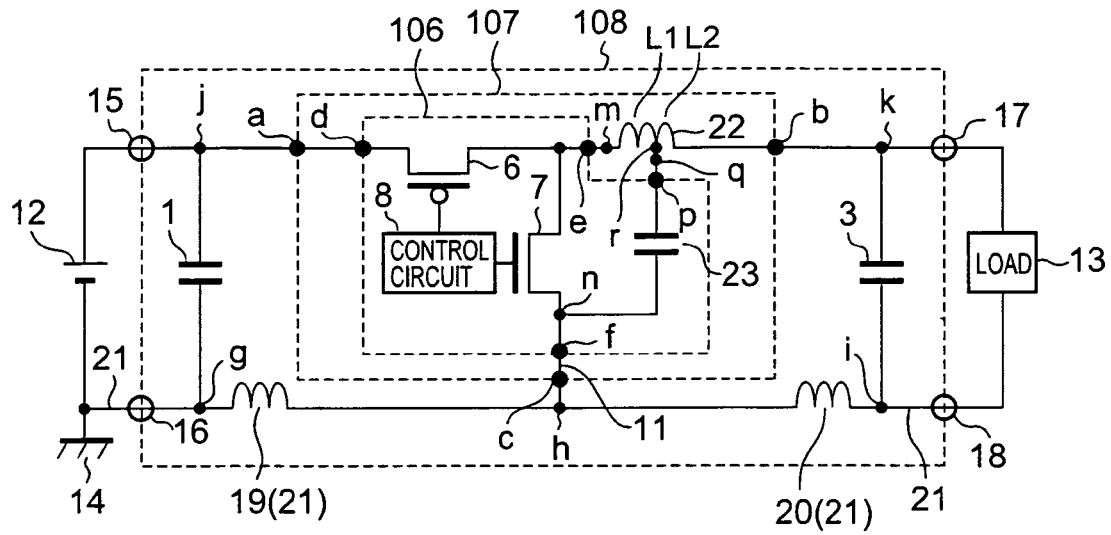
FIG. 6A is a circuit diagram of important parts of a micro-power source device according to a second embodiment of the invention.
Figure 6B:
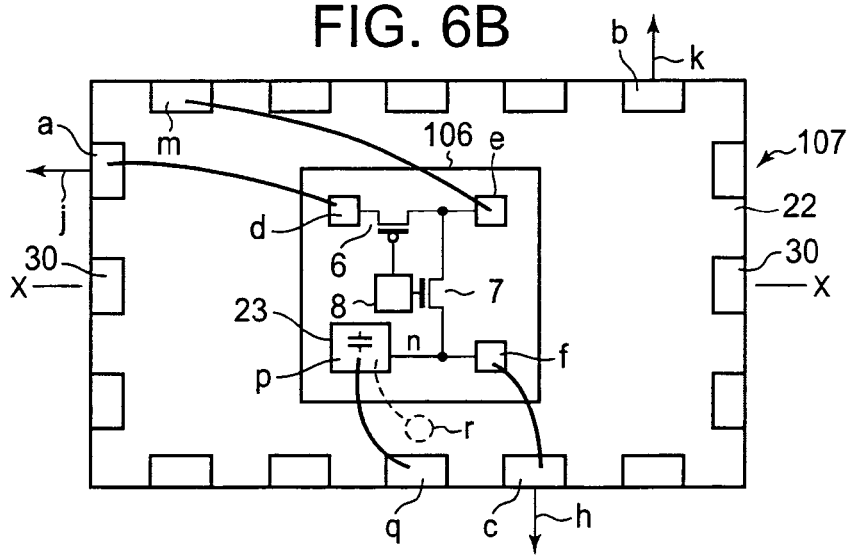
FIG. 6B is a plan view of important parts of a micro-power source module according to the second embodiment.
Figure 6C:
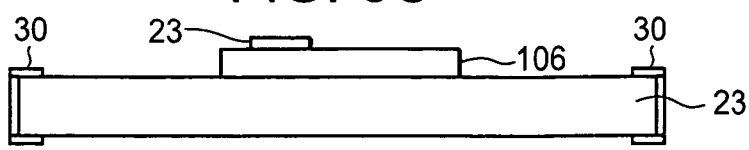
FIG. 6C is a sectional view taken along line X-X in FIG. 6B.
Figure 6D:
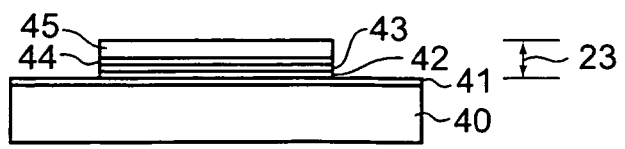
FIG. 6D is a sectional view of important parts of an integrated capacitor.

FIG. 6A is a circuit diagram of important parts of a micro-power source device according to a second embodiment of the invention. FIG. 6B is a plan view of important parts of a micro-power source module according to the second embodiment. FIG. 6C is a sectional view taken along line X-X in FIG. 6B. FIG. 6D is a sectional view of important parts of an integrated capacitor. FIG. 7 is a detailed plan view of an inductor used in the micro-power source module of FIG. 6B. The micro-power source device 108 of FIGS. 6A-6D is different from the micro-power source device 103 of FIGS. 1A-1C in the following points. First, an integrated capacitor 23 as a noise absorption capacitor having a small capacitance on the order of picofarads is formed on the same semiconductor substrate 40 as a power source IC 106 is formed. Second, a divided inductor 22, which is divided at a dividing point r, is used and an intermediate tap q which is connected to the dividing point r is connected to one terminal p of the integrated capacitor 23 and the other terminal n of the integrated capacitor 23 is connected to the source S of the off-MOSFET 7. The integrated capacitor 23 and divided the inductor 22 constitute a T-type filter. That is, the inventor proposes the use of an integrated capacitor as part of a T-type filter to obtain a sufficient attenuation characteristic even with the integrated capacitor, because as described above a T-type filter can attain larger attenuation than a combination of an independent inductor and capacitor. As shown in FIG. 6D, the integrated capacitor 23 is a parallel plate capacitor in which an interlayer insulating film 41 is formed on the same semiconductor substrate 40 as the power source IC 106 is formed, a first polysilicon film 42 as an electrode is formed on the interlayer insulating film 41, an oxide film 43 of tens of nanometers in thickness is formed on the first polysilicon film 42, a second polysilicon film 44 as an electrode is formed on the oxide film 43, and a metal film 45 to serve as an electrode/interconnection is formed on the second polysilicon film 44. The first polysilicon film 42 is connected to a metal interconnection (not shown).

As shown in FIG. 7, in the inductor 22, a solenoid coil is formed in such a manner that a top coil pattern 24a and a bottom coil pattern 24b are formed on both sides of a ferrite substrate 24 and are connected to each other by connection conductors 24c through through-holes that are formed through the ferrite substrate 24. External terminals 30 such as the relay terminals a and c, the inductor terminals m and b, the division terminal (intermediate tap) q are arranged along the periphery of the ferrite substrate 24; each terminal 30 is formed in such a manner that a front-side portion and a back-side portion are connected to each other on a side surface of the ferrite substrate 24. Among the plural terminals 30, the two terminals m and b are connected to the two respective ends of the solenoid coil inside the inductor 22 and connected to the terminal e of the power source IC 106 and the terminal k of the output capacitor 3, respectively, outside the inductor 22. The division terminal q is connected to the integrated capacitor 23. The terminals a and c are relay terminals for connecting the terminals d and f of the power source IC 106 to wiring patterns on the printed circuit board, the input capacitor 1, the output capacitor 3, etc. Alternatively, the dividing point r of the solenoid coil may be connected to the terminal p of the integrated capacitor 23 directly (i.e., without interposition of the division terminal q). Merely incorporating capacitors having a small capacitance on the order of picofarads as first and second noise absorption capacitors cannot attain low-noise performance (see FIG. 5). In view of this, to attain a sufficient attenuation effect even with the integrated capacitor 23 having a small capacitance on the order of picofarads, the T-type filter is formed by combining the integrated capacitor 23 with the divided inductor 22 and utilizing its large inductance on the order of microhenries.

Because of the use of the oxide film 43, which is a low-permittivity material, the integrated capacitor 23 has a small tan δ value and exhibits a small ESR value even if the capacitance is small. As such, the integrated capacitor 23 is expected to provide a sufficient noise reducing effect. Furthermore, since the integrated capacitor 23 is formed on the semiconductor substrate 40, the occupied space of the micro-power source module 107 is not increased. Still further, since the height (thickness) of the integrated capacitor 23 is at most on the order of micrometers, the occupied height of the micro-power source module 107 is not increased either. In addition, since the integrated capacitor 23 can be formed by an IC process at the same time as other portions are formed, the manufacturing cost is not increased. Let L1 represent the inductance of the portion of the inductor 22 between the one terminal m and the dividing point r and let L2 represent the inductance of the portion of the inductor 22 between the other terminal b and the dividing point r; then, the undivided inductance L (=L1+L2) is equal to 2 µH. The T-type filter (an π-type filter if the output capacitor 3 on the printed circuit board is included) is formed by connecting the integrated capacitor 23 (Cm), which is a decoupling capacitor to the division terminal q of the divided inductor 22. Where the inductor 23 is not divided, the division ratio L1:L2=10:0. Since the integrated capacitor 23 is connected to the division terminal q of the inductor 22, the division ratio is irrelevant to the GND inductances of the first and second ground lines 19 and 20 which are wired on the printed circuit board outside the micro-power source module 107. Therefore, superior low-noise performance can be attained by determining an optimum division ratio L1:L2 that depends on only L1 and L2 of the divided inductor 22 and the capacitance of the integrated capacitor 23, which is on the order of picofarads.

Figure 8:
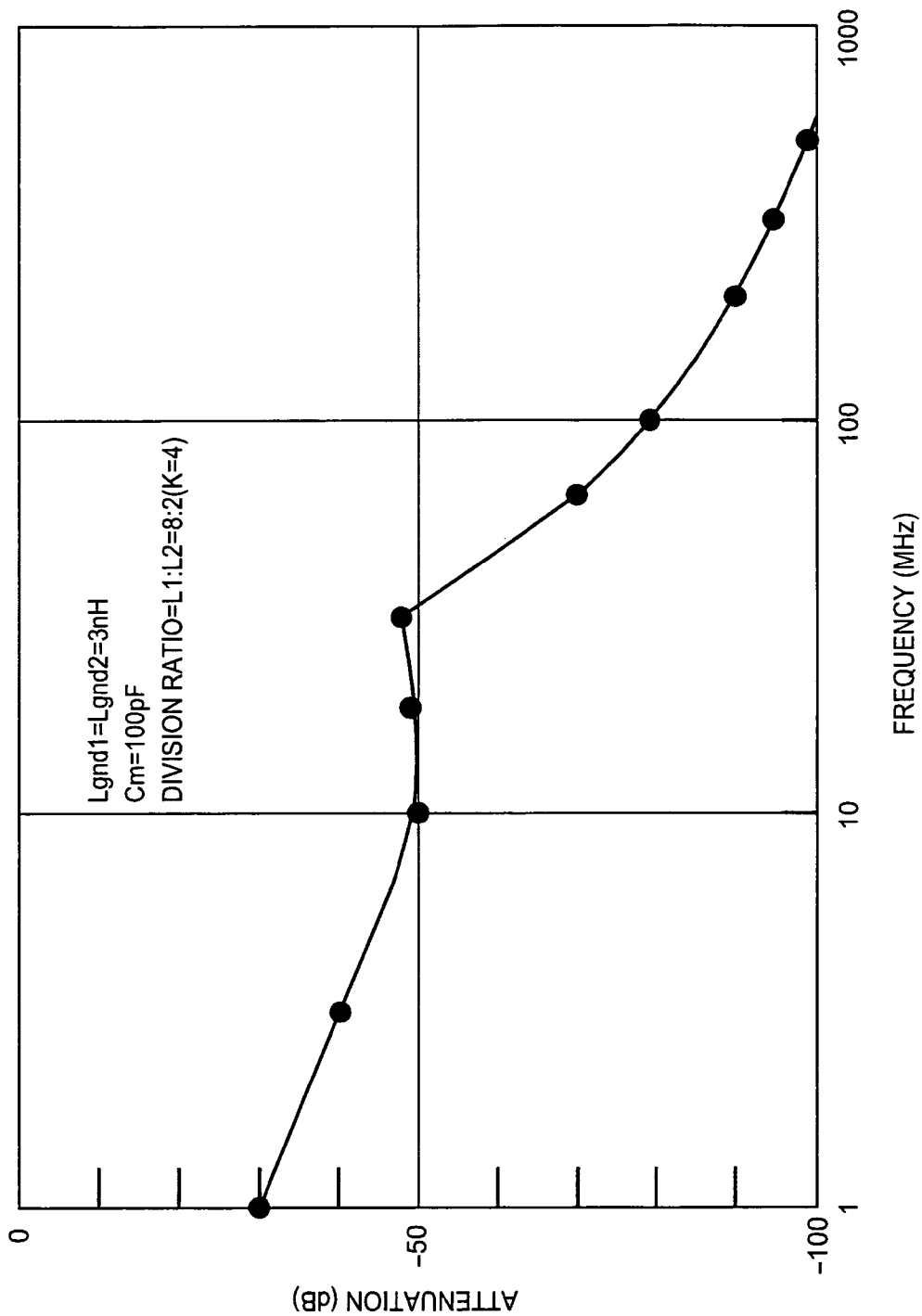
FIG. 8 is a graph showing an attenuation characteristic of a case that the division ratio L1:L2 of the inductor is 8:2 (K=L1/L2=4) and the capacitance of an integrated capacitor 23 is 100 pF.
Figure 9:
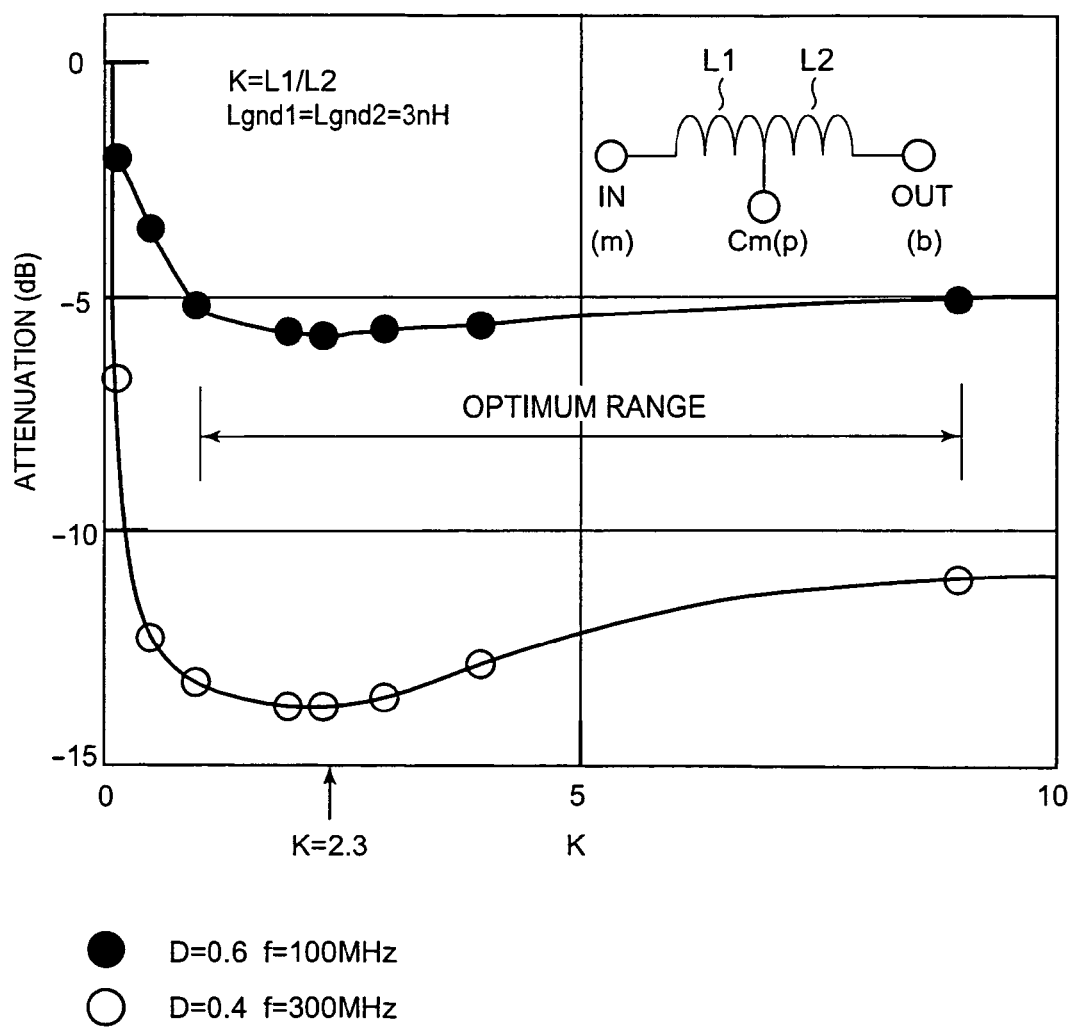
FIG. 9 is a graph showing a relationship between the attenuation amount and the division ratio K.
Figure 14:
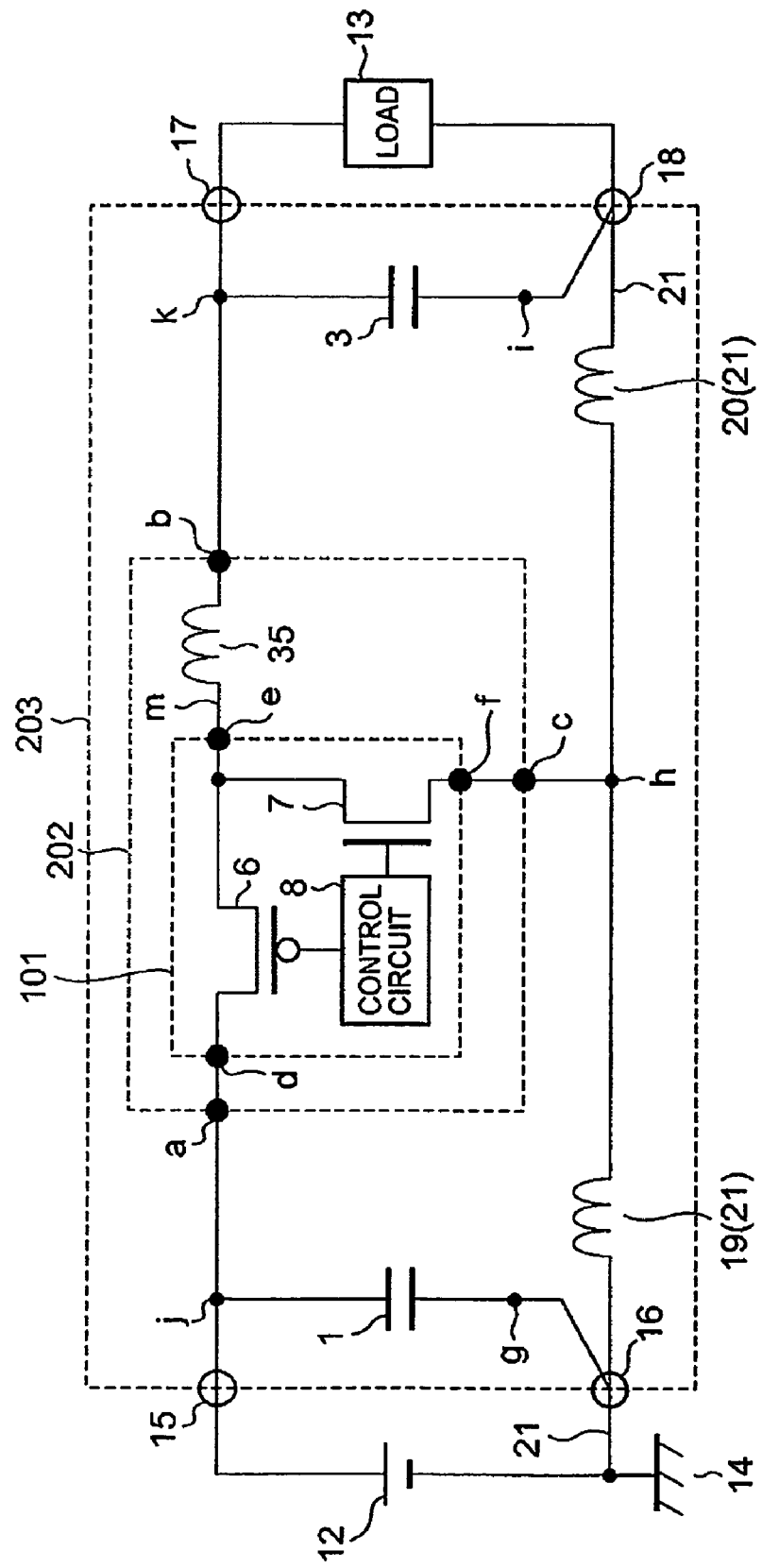
FIG. 14 is a circuit diagram of a conventional POL power source.
Figure 15:
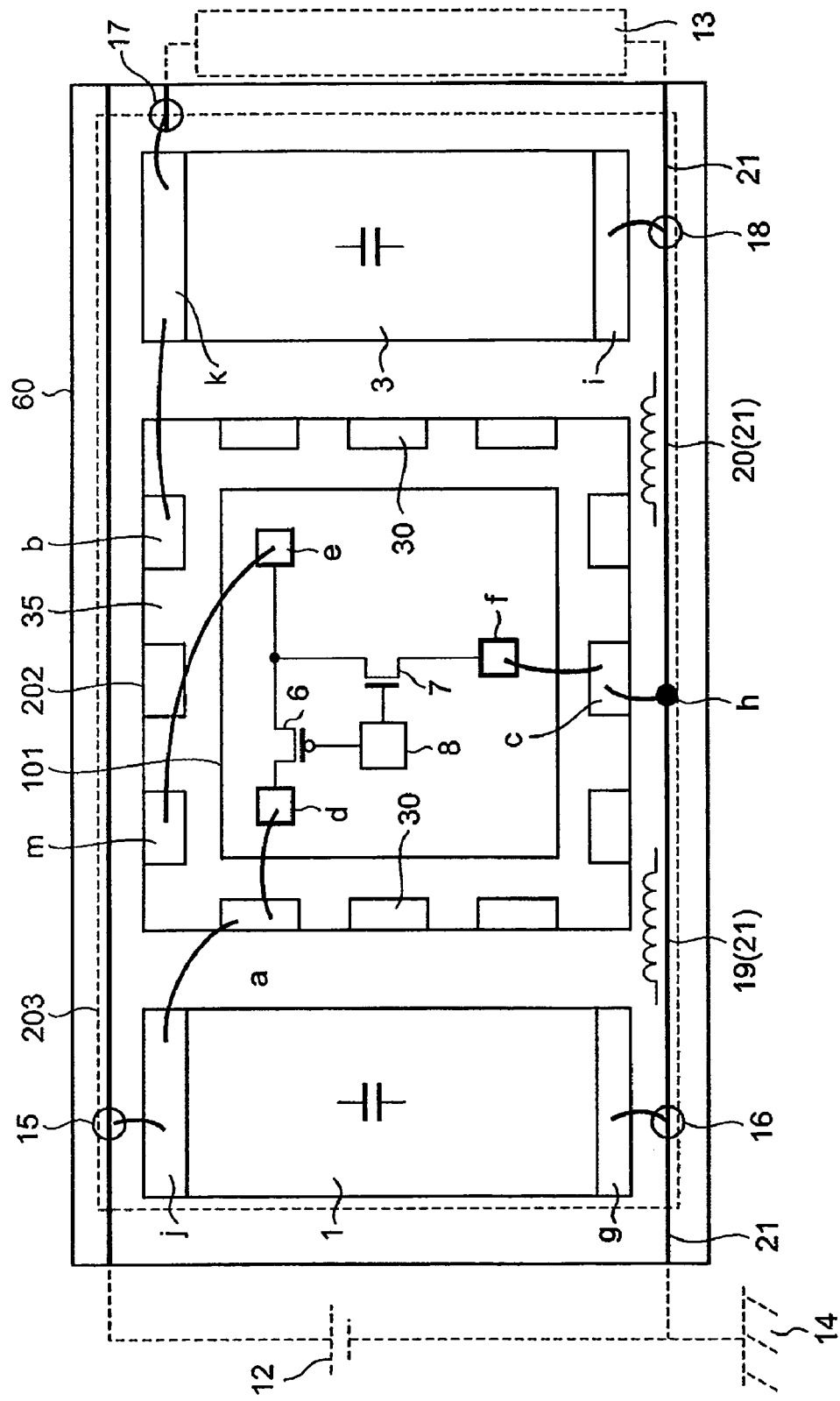
FIG. 15 is a layout diagram of the conventional POL power source on a printed circuit board.
Figure 16:
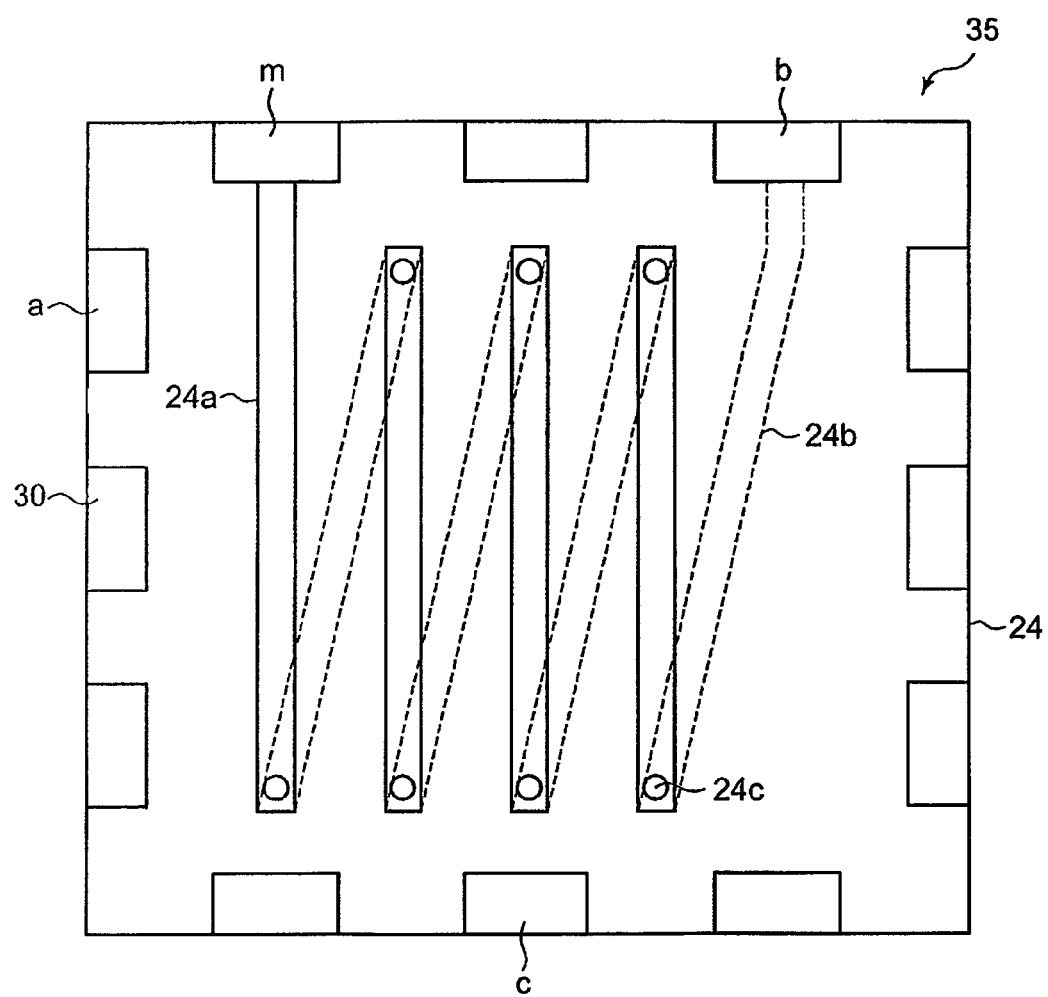
FIG. 16 is a plan view of important parts of a conventional inductor.
Figure 17:
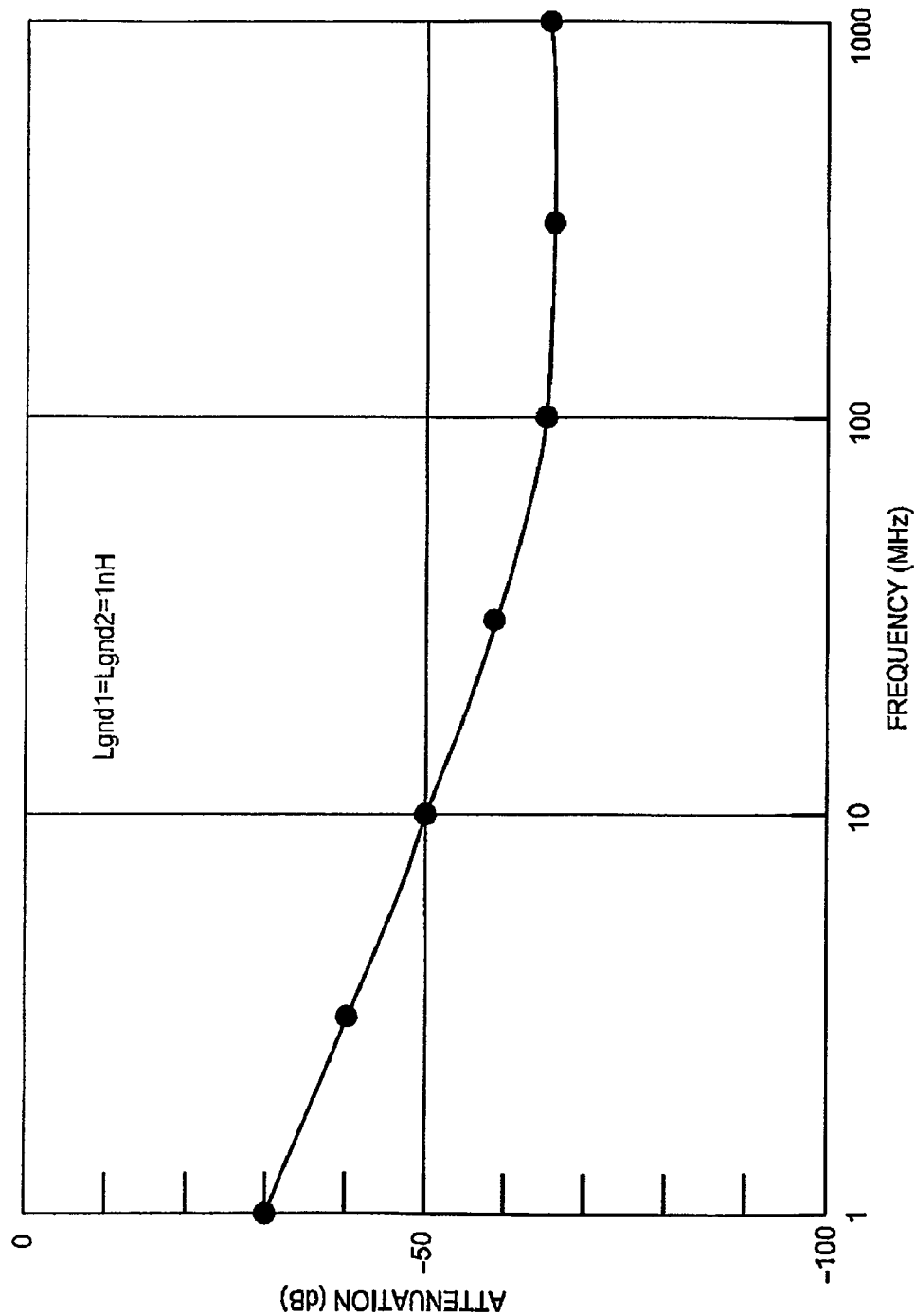
FIG. 17 is a graph showing an attenuation characteristic of a case that Lgnd1 and Lgnd2 of the POL power source of FIG. 14 are 1 nH.

The integrated capacitor 23 is different from a ceramic capacitor in the following points. Whereas it is difficult to provide a large capacitance with the integrated capacitor 23, since no high-permittivity material is used, the integrated capacitor 23 has a small tan δ value and exhibits a small ESR value even if the capacitance is small (on the order of picofarads). As such, the integrated capacitor 23 is effective in noise reduction. FIG. 8 shows an attenuation characteristic of a case that the division ratio L1:L2 of the inductor 22 is 8:2 (K=L1/L2=4) and the capacitance of the integrated capacitor 23 is 100 pF. It is seen from FIG. 8 that the use of the single integrated capacitor 23 having a small capacitance and the divided inductor 22 makes it possible to provide better low-noise characteristic than the case of forming, on the inductor 2, the two noise absorption capacitors 4 and 5 having a large capacitance 0.01 µF (see the characteristic of FIG. 2). A simulation circuit used was such that in the circuit of FIG. 19B the divided inductor 22 is used in place of the inductor 35 and the integrated capacitor 23 is connected to its division terminal q so that a T-type filter is formed. FIG. 9 is a graph showing a relationship between the attenuation amount and the division ratio K. This attenuation amount is an attenuation amount that involves an off-time one and an on-time one and is averaged over one cycle. A calculation method is as follows. First, attenuation amounts at particular frequencies (100 MHz, 200 MHz, and 300 MHz) of the conventional circuit of FIG. 14 not having a T-type filter and the circuit of this embodiment having the T-type filter were obtained by performing simulations and comparing peak values of input and output signals in each of the on period and the off period.

Let symbols aa, bb, cc, and dd represent an attenuation amount of the conventional circuit in the on period, an attenuation amount of the circuit of the embodiment in the on period, an attenuation amount of the conventional circuit in the off period, and an attenuation amount of the circuit of the embodiment in the off period, respectively. For example, if the on period and the off period account for 40% and 60%, respectively, that is, the on-duty ratio D (=(on period)/{(on period)+(off period)}) is 0.4, the averaged attenuation amount ee (averaged over one cycle) is given by $$ee=\{(bb-aa)\times 0.4+(dd-cc)\times 0.6\}/2.$$

Calculations were made for on-duty ratio/frequency combinations from on-duty ratios 0.6 and 0.4 and frequencies 100 MHz, 200 MHz, and 300 MHz. FIG. 9 shows a calculation result of smallest attenuation amounts ee that occurred when the on-duty ratio D was 0.6 and the frequency was 100 MHz and a calculation result of largest attenuation amounts ee that occurred when the on-duty ratio D was 0.4 and the frequency was 300 MHz. The GND inductances Lgnd1 and Lgnd2 were set at 3 nH. Where the on-duty ratio is 0.6 and the frequency is 100 MHz, the attenuation amount ee (absolute value) is smaller than −5 dB and hence sufficient low-noise performance is not attained when K is smaller than 1. Therefore, K should be larger than or equal to 1. When K is larger than 9 (L1:L2=9:1), the attenuation amount ee (absolute value) is smaller than −5 dB. That is, the upper limit of K is 9. The best low-noise performance is obtained when K=2.3 (L1:L2=7:3).

In summary, the attenuation amount ee (absolute value) can be made larger than, −5 dB and hence a sufficient noise reducing effect can be obtained by setting K in the range of 1 to 9. In this embodiment, it is assumed that a sufficient noise reducing effect is obtained if the attenuation amount ee (absolute value) of an attenuation characteristic is larger than −5 dB. In the micro-power source module 107, the integrated capacitor 23 (about 100 pF) is formed in the power source IC 106 (IC chip) and the power source IC 106 is formed on and integrated with the divided inductor 22. The micro-power source module 107 thus dispenses with the need for providing ceramic capacitors separately in the manner shown in FIGS. 1A-1C. Therefore, the inherent features of the micro-power source module 107, that is, miniaturization and noise reduction, can be exercised without increase in the number of mounting/assembling steps. As a result, like the micro-power source module 102 of FIGS. 1A-1C, the micro-power source module 107 can reduce the influence of the performance of a printed circuit board (i.e., the magnitudes of the GND inductances) and hence can be easy to use to set makers. A modification of this embodiment, which is promising in the future, is such that the inductor 22 is divided at plural locations and capacitors having a smaller capacitance (tens of picofarads) than the integrated capacitor 23 used in the embodiment are used (inductor multiple division-integrated capacitors composite filter).

Embodiment 3

Figure 10A:
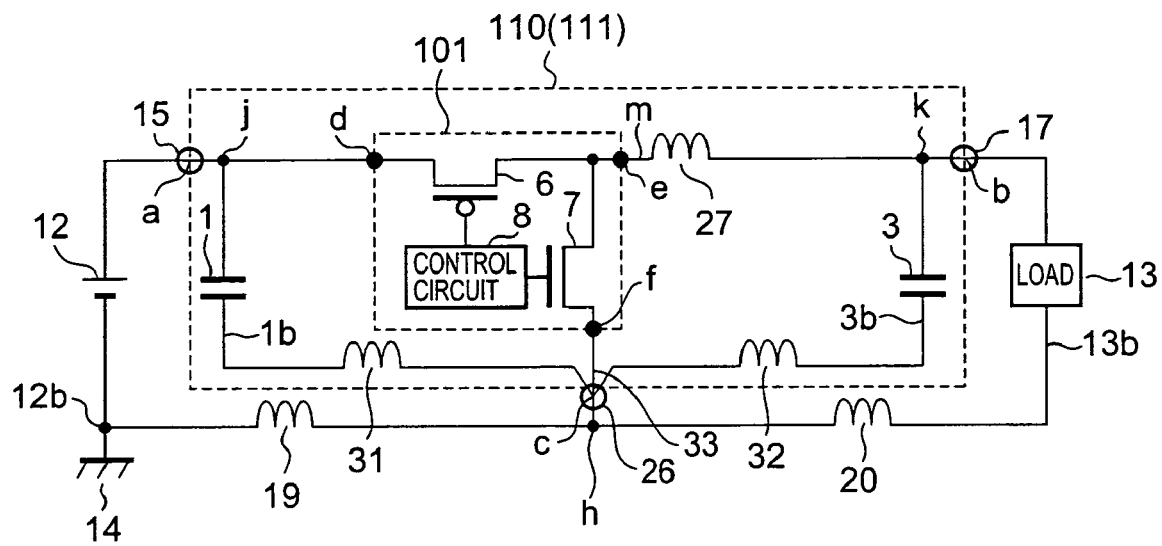
FIG. 10A is a circuit diagram of important parts of a micro-power source device according to a third embodiment of the invention.
Figure 10B:
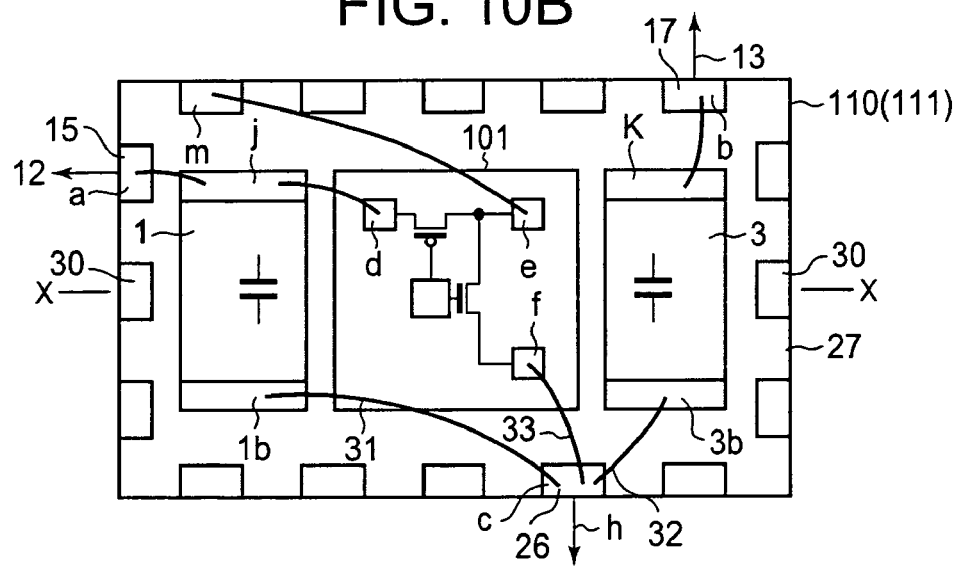
FIG. 10B is a plan view of important parts of a micro-power source module according to the third embodiment.
Figure 10C:
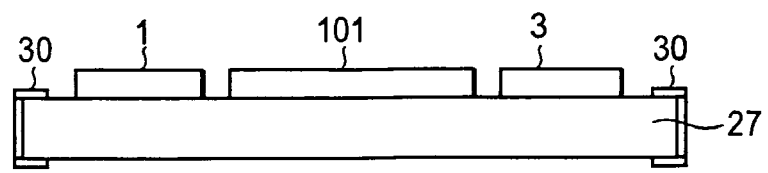
FIG. 10C is a sectional view taken along line X-X in FIG. 10B.
Figure 11:
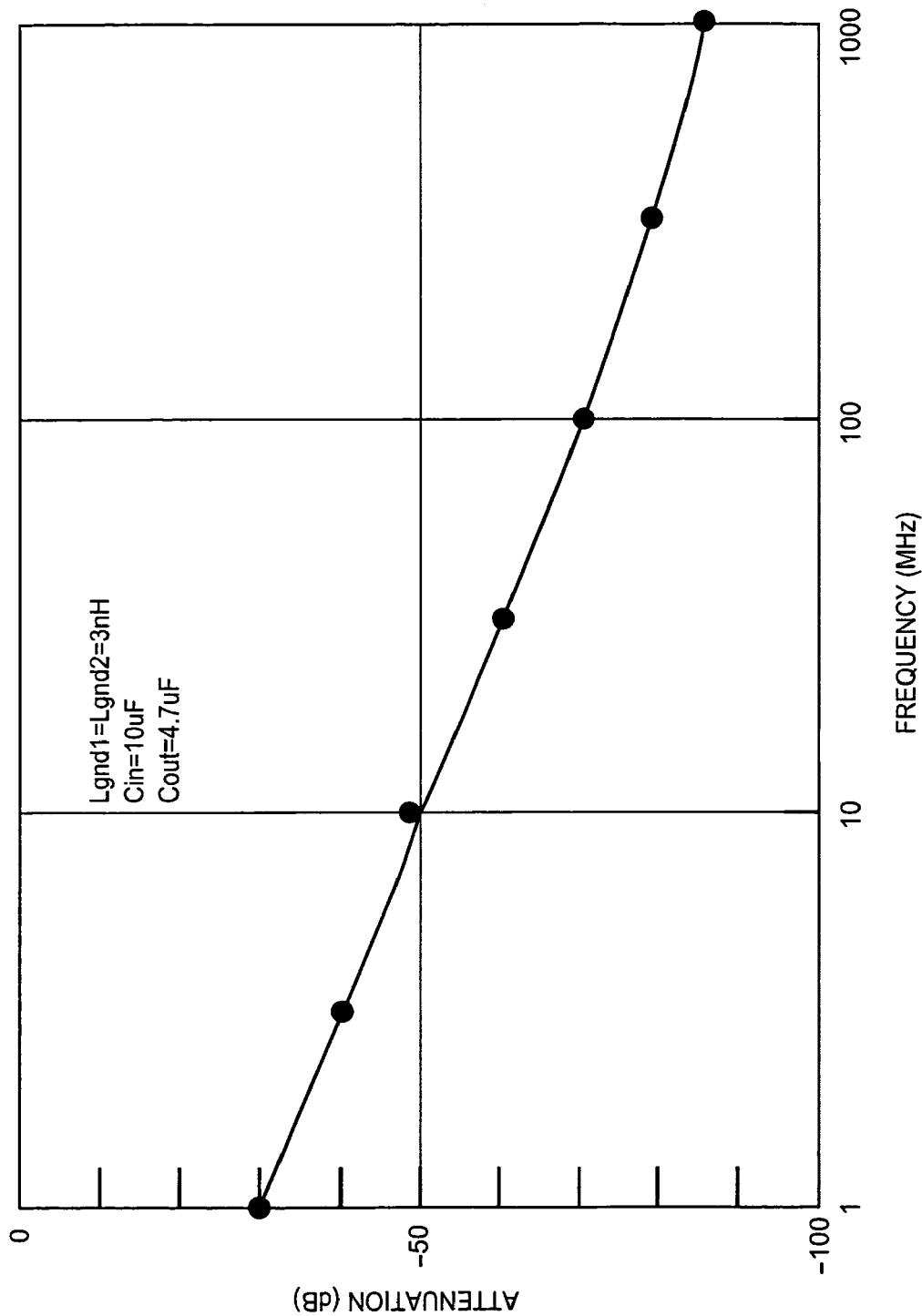
FIG. 11 is a graph showing an attenuation characteristic of the micro-power source device (micro-power source module) of FIGS. 10A-10C.

FIG. 10A is a circuit diagram of important parts of a micro-power source device according to a third embodiment of the invention. FIG. 10B is a plan view of important parts of a micro-power source module according to the third embodiment. FIG. 10C is a sectional view taken along line X-X in FIG. 10B. In this embodiment, a micro-power source module 110 solely constitutes a micro-power source device 111. The micro-power source device 111 according to this embodiment is similar in configuration to the micro-power source device 103 of FIGS. 1A-1C and is different from the latter in that the noise absorption capacitors 4 and 5 are not used and the input capacitor 1 and the output capacitor 3 are mounted on an inductor 27 adjacent to the power source IC 101. In FIGS. 10A-10C, reference numeral 31 denotes a fourth line that connects a terminal 1b of the input capacitor 1 to an input/output terminal 26 (corresponds to the terminal c in FIGS. 1A-1C). Reference numeral 32 denotes a fifth line that connects a terminal 3b of the output capacitor 3 to the input/output terminal 26. Reference numeral 33 denotes a sixth line that connects the ground terminal f of the power source IC 101 to the input/output terminal 26. With this configuration, the influence of the first and second GND inductances, which are the inductances of the first and second ground lines 19 and 20, is eliminated. Furthermore, since the fourth and fifth lines 31 and 32 are formed on the inductor 27 and their inductances are one order or more smaller than the first and second GND inductances, low-noise performance can be obtained as evidenced by a simulation result of FIG. 11. Still further, the occupied area of the micro-power source device 111 is smaller than that of the micro-power source device 103 of FIGS. 1A-1C because the input and output capacitors 1 and 3 are placed on and integrated with the inductor 27 and the noise absorption capacitors 4 and 5 are removed.

In addition, the micro-power source module 110 has a two-layer lamination structure and hence is smaller in occupied height than the micro-power source module of JP-A-2004-72815, which has the three-layer lamination structure. The micro-power source module 110 can thus satisfy the requirements of set makers (e.g., cell phone manufacturers) that are severe in occupied height.

Embodiment 4

Figure 12A:
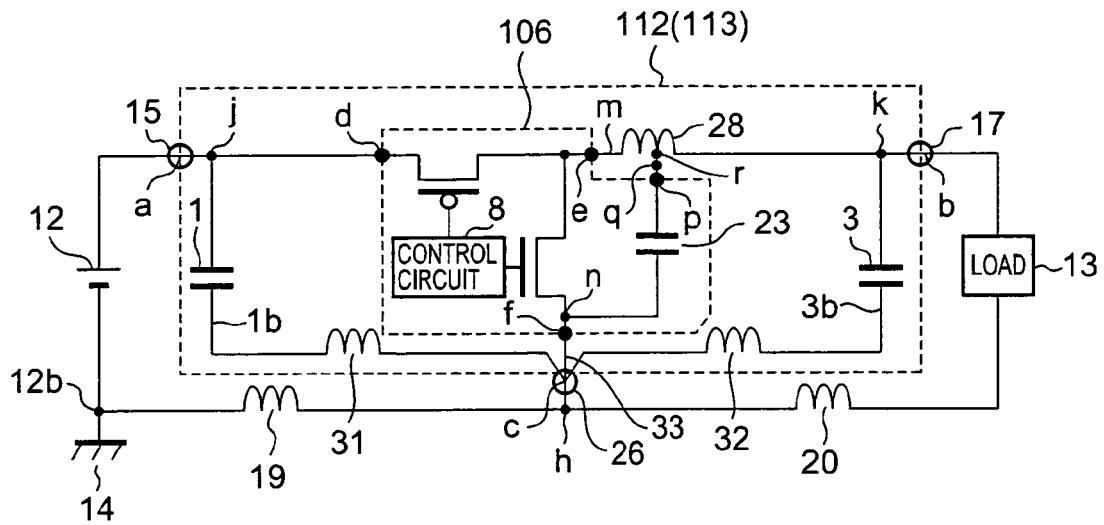
FIG. 12A is a circuit diagram of important parts of a micro-power source device according to a fourth embodiment of the invention.
Figure 12B:
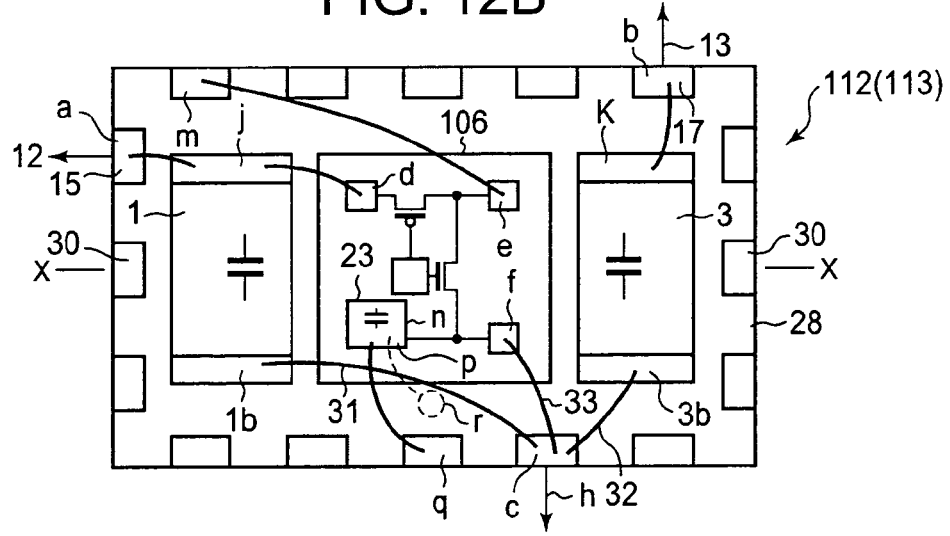
FIG. 12B is a plan view of important parts of a micro-power source module according to the fourth embodiment.
Figure 12C:
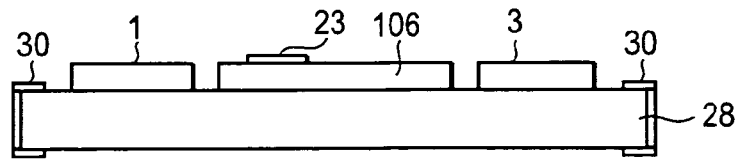
FIG. 12C is a sectional view taken along line X-X in FIG. 12B.
Figure 13:
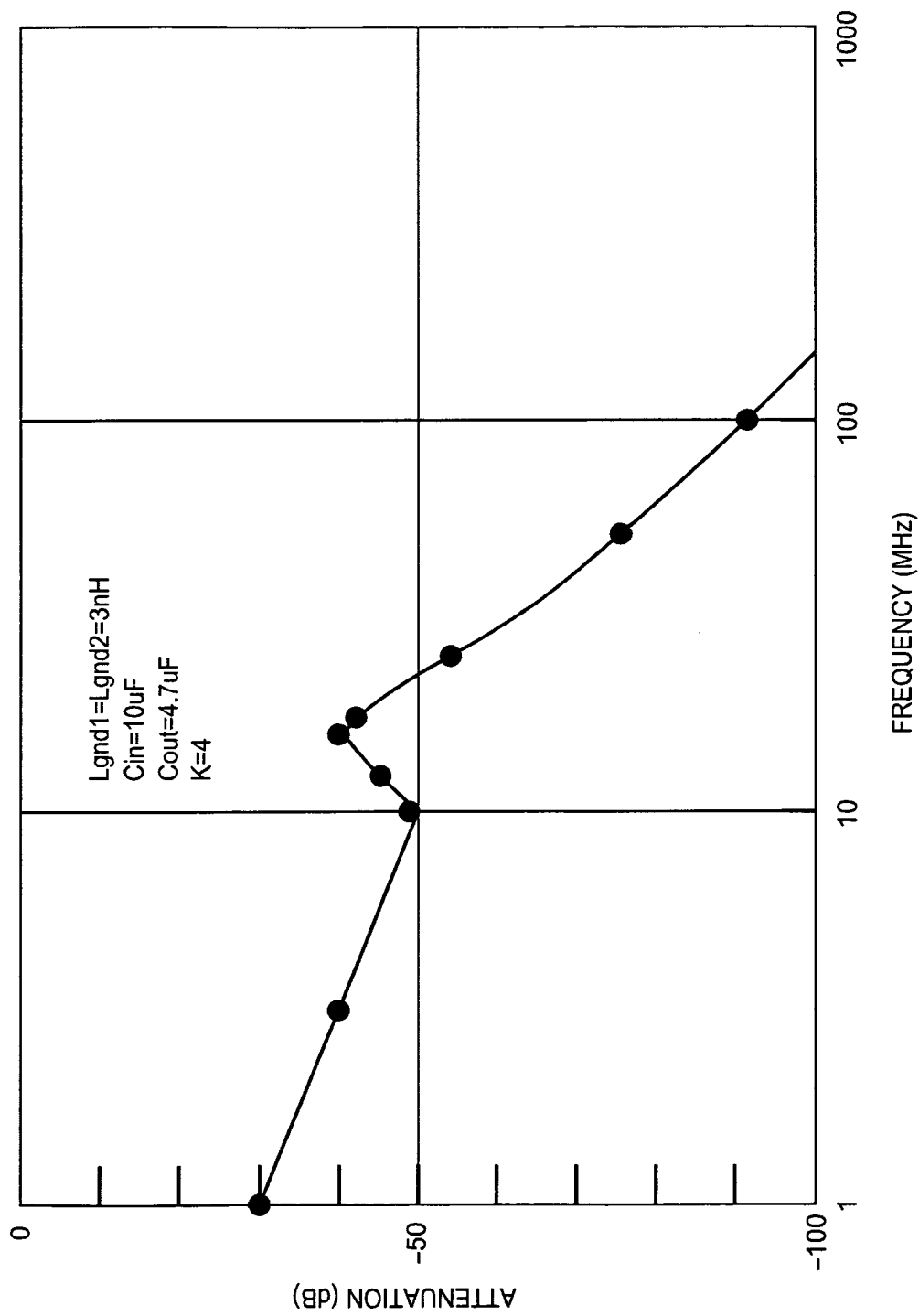
FIG. 13 is a graph showing an attenuation characteristic of the micro-power source device (micro-power source module) of FIGS. 12A-12C.

FIG. 12A is a circuit diagram of important parts of a micro-power source device according to a fourth embodiment of the invention. FIG. 12B is a plan view of important parts of a micro-power source module according to the fourth embodiment. FIG. 12C is a sectional view taken along line X-X in FIG. 12B. In this embodiment, a micro-power source module 112 solely constitutes a micro-power source device 113. The micro-power source device 113 according to this embodiment is similar in configuration to the micro-power source device 111 of FIGS. 10A-10C and is different from the latter in that the same T-type filter as shown in FIGS. 6A-6D is added. With this configuration, the occupied area and height of the micro-power source module 112 are the same as those of the micro-power source module 110 of FIGS. 10A-10C and the low-noise performance of the micro-power source device 113 is better than that of the micro-power source device 103 of FIGS. 1A-1C and better than that of even the micro-power source device of FIGS. 6A-6D as evidenced by a simulation result of FIG. 13. Whereas the occupied height of the micro-power source module 112 of FIGS. 12A-12C is approximately the same as that of the micro-power source module 107 of FIGS. 6A-6D (second embodiment), the occupied area of the former is larger than that of the latter. However, since all the necessary components are mounted on the divided inductor 28, the occupied area of the micro-power source device 113 according to this embodiment is smaller than that of the micro-power source devices 103 and 108 according to the first and second embodiments in which part of the components are mounted on the printed circuit board. Therefore, this embodiment can contribute to miniaturization of portable devices such as cell phones. Since the T-type filter is formed, this embodiment can provide better now-noise performance than the third embodiment. Furthermore, since the GND inductances can be made extremely small, this embodiment can provide better low-noise performance than the second embodiment.

In each of the first to fourth embodiments, the POL power source (micro-power source device) incorporating the micro-power source module is a step-down converter that is now used most commonly. However, the concepts that the noise filter formed by using the noise absorption capacitors 4 and 5 which are ceramic capacitors are formed on the inductor 2 (first embodiment), the T-type filter is formed by forming the integrated capacitor 23 (noise absorption capacitor) whose capacitance is on the order of picofarads on the semiconductor substrate 40 on which the power source IC 106 is also formed and combining the integrated capacitor 23 with the divided inductor 22 (second embodiment), and the input and output capacitors 1 and 3 are mounted on the inductor 27 or 28 (third and fourth embodiments) can also be applied to, for example, other types of chopper converters (boosting type and boosting/step-down type). The height of each of the micro-power source modules 102, 107, 110, and 112 can be made smaller than 1 mm as required in cell phones etc. because the heights of the inductor, the power source IC, and the ceramic capacitors are about 0.5 mm, about 0.3 mm, and about 0.4 mm, respectively.

It will of course be appreciated by those skilled in the art that many variations and substitutions are possible and that the invention may be practiced otherwise than as specifically disclosed herein without departing from the scope thereof.

What is claimed is:

1. A micro-power source module, comprising:
    an inductor;
    a power source IC provided on the inductor; and
    at least one capacitor provided on the inductor, and configured to reduce noise,
    wherein the inductor has plural terminals and an intermediate tap and one of the plural terminals is connected both to a ground terminal of the power source IC and to a ground line that is disposed outside the inductor.

2. The micro-power source module according to claim 1, wherein the inductor is a divided inductor, which is in the form of a divided solenoid coil, and at least one of the capacitors is integrated with the power source IC on a semiconductor substrate.

3. A micro-power source module which is part of a micro-power source device, comprising:
    a high-potential-side device input terminal and a low-potential-side device input terminal connected to a high potential side of an external power source and a low potential side, connected to a ground, of the external power source, respectively;
    an input capacitor having one terminal connected to the high-potential-side device input terminal and another terminal connected to the low-potential-side device input terminal;
    a power source IC having a high-potential-side input terminal connected to the one terminal of the input capacitor;
    an inductor having one terminal connected to a high-potential-side output terminal of the power source IC;

an output capacitor having one terminal connected to another terminal of the inductor;

a high-potential-side device output terminal connected to the one terminal of the output capacitor;

a low-potential-side device output terminal; and ground lines that connect the low-potential-side device input terminal to another terminal of the input capacitor, connect the another terminal of the output capacitor to the low-potential-side device output terminal, and connect the low-potential-side device input terminal, a ground terminal of the power source IC, and the low-potential-side device output terminal to each other, a first ground line extending between the low-potential-side device input terminal and a connecting point to which the ground terminal of the power source IC and a second ground line extending between the connecting point and low-potential-side device output terminal wherein the power source IC is provided on the inductor and further includes an on-MOSFET, an off-MOSFET or off-diode, and a control circuit for controlling the on-MOSFET and the off-MOSFET or off-diode, a drain of the on-MOSFET is connected to a drain or cathode of the off-MOSFET or off-diode, a source of the on-MOSFET is connected to the high-potential-side input terminal of the power source IC, the drain of the on-MOSFET is connected to the high-potential-side output terminal of the power source IC, and a source or anode of the off-MOSFET or off-diode is connected to the ground terminal of the power source IC; and first and second noise absorption capacitors are provided on the inductor adjacent to the power source IC, the first noise absorption capacitor is connected between the source of the on-MOSFET and the source of the off-MOSFET or off-diode via the first ground line, and the second noise absorption capacitor is connected between said another terminal of the inductor and the source or anode of the off-MOSFET or off-diode via the second ground line.

4. The micro-power source module according to claim 3, wherein each of the first and second noise absorption capacitors is a decoupling capacitor that is a ceramic capacitor.

5. The micro-power source module according to claim 4, wherein the noise absorption capacitor is an integrated capacitor comprising an interlayer insulating film formed on the semiconductor substrate, a first polysilicon film formed on the interlayer insulating film, an insulating film formed on the first polysilicon film, and a second polysilicon film formed on the insulating film.

6. The micro-power source module according to claim 4, wherein the insulating film is an oxide film.

7. The micro-power source module according to claim 3, wherein the on-MOSFET is a lateral p-channel MOSFET, the off-MOSFET is a lateral n-channel MOSFET, and each of the on-MOSFET and the off-MOSFET is a bidirectional MOSFET which allows a current to flow bidirectionally between the source and the drain when a gate receives an on signal.

8. The micro-power source module according to claim 3, wherein the off-MOSFET or off-diode is a diode having a cathode that is connected to the high-potential-side output terminal of the power source IC and an anode that is connected to the ground terminal of the power source IC.

9. A micro-power source module that is part of a micro-power source device comprising:

a high-potential-side device input terminal and a low-potential-side device input terminal that are connected to a high potential side of an external power source and a low potential side, connected to a ground, of the external power source, respectively;

an input capacitor having one terminal that is connected to the high-potential-side device input terminal and another terminal that is connected to the low-potential-side device input terminal;

a power source IC having a high-potential-side input terminal that is connected to the one terminal of the input capacitor;

an inductor having one terminal that is connected to a high-potential-side output terminal of the power source IC;

an output capacitor having one terminal that is connected to another terminal of the inductor;

a high-potential-side device output terminal connected to the one terminal of the output capacitor;

a low-potential-side device output terminal; and ground lines that connect the low-potential-side device input terminal to another terminal of the input capacitor, connect said another terminal of the output capacitor to the low-potential-side device output terminal, and connect the low-potential-side device input terminal, a ground terminal of the power source IC, and the low-potential-side device output terminal to each other, a first ground line extending between the low-potential-side device input terminal and a connecting point to which the ground terminal of the power source IC and a second ground line extending between the connecting point and low-potential-side device output terminal wherein the inductor is a divided inductor;

the power source IC is provided on the inductor and includes an on-MOSFET, an off-MOSFET or off-diode, and a control circuit for controlling the on-MOSFET and the off-MOSFET or off-diode, a drain of the on-MOSFET is connected to a drain or cathode of the off-MOSFET or off-diode, a source of the on-MOSFET is connected to the high-potential-side input terminal of the power source IC, the drain of the on-MOSFET is connected to the high-potential-side output terminal of the power source IC, and a source or anode of the off-MOSFET or off-diode is connected to the ground terminal of the power source IC; and a noise absorption capacitor is formed on a same semiconductor substrate as the power source IC is formed, wherein one terminal of the noise absorption capacitor is connected to a dividing point or an intermediate tap, connected to the dividing point, of the inductor and another terminal of the noise absorption capacitor is connected to the source or anode of the off-MOSFET or off-diode.

10. The micro-power source module according to claim 9, wherein the on-MOSFET is a lateral p-channel MOSFET, the off-MOSFET is a lateral n-channel MOSFET, and each of the on-MOSFET and the off-MOSFET is a bidirectional MOSFET which allows a current to flow bidirectionally between the source and the drain when a gate receives an on signal.

11. The micro-power source module according to claim 9, where a division ratio $K=L1/L2$ is in a range of 1 to 9, where $L1$ is an inductance of a portion of the inductor from its one terminal to the dividing point and $L2$ is an inductance of another portion of the inductor from the dividing point to said another terminal.

12. The micro-power source module according to claim 9, wherein the off-MOSFET or off-diode is a diode having a cathode that is connected to the high-potential-side output terminal of the power source IC and an anode that, is connected to the ground terminal of the power source IC.

13. A micro-power source module that is part of a micro-power source device comprising:
a high-potential-side device input terminal connected to a high potential side of an external power source;
an input capacitor having one terminal that is connected to the high-potential-side device input terminal;
a power source IC having a high-potential-side input terminal that is connected to the one terminal of the input capacitor;
an inductor having one terminal that is connected to a high-potential-side output terminal of the power source IC;
an output capacitor having one terminal that is connected to another terminal of the inductor; and
a high-potential-side device output terminal connected to the one terminal of the output capacitor;
wherein a low-potential-side device input/output terminal is connected to another terminal of the input capacitor, and to another terminal of the output capacitor;
the power source IC is provided on the inductor and includes an on-MOSFET, an off-MOSFET or off-diode, and a control circuit for controlling the on-MOSFET and the off-MOSFET or off-diode, a drain of the on-MOSFET is connected to a drain or cathode of the off-MOSFET or off-diode, a source of the on-MOSFET is connected to the high-potential-side input terminal of the power source IC, the drain of the on-MOSFET is connected to the high-potential-side output terminal of the power source IC, a source or anode of the off-MOSFET or off-diode is connected to the ground terminal of the power source IC, and the ground terminal of the power source IC is connected to the low-potential-side device input/output terminal; and
the input and output capacitors are provided on the inductor adjacent to the power source IC.

14. The micro-power source module according to claim 13, further comprising a noise absorption capacitor formed on a same semiconductor substrate as the power source IC is formed, wherein the inductor is a divided inductor, one terminal of the noise absorption capacitor is connected to a dividing point or an intermediate tap, connected to the dividing point, of the inductor, and another terminal of the noise absorption capacitor is connected to the source of the off-MOSFET or off-diode.

15. The micro-power source module according to claim 14, wherein the noise absorption capacitor is an integrated capacitor comprising an interlayer insulating film formed on the semiconductor substrate, a first polysilicon film formed on the interlayer insulating film, an insulating film formed on the first polysilicon film, and a second polysilicon film formed on the insulating film.

16. The micro-power source module according to claim 15, wherein the insulating film is an oxide film.

17. The micro-power source module according to claim 13, where a division ratio $K=L_1/L_2$ is in a range of 1 to 9, where $L_1$ is an inductance of a portion of the inductor from its one terminal to the dividing point and $L_2$ is an inductance of another portion of the inductor from the dividing point to said another terminal.

18. The micro-power source module according to claim 13, wherein the on-MOSFET is a lateral p-channel MOSFET, the off-MOSFET is a lateral n-channel MOSFET, and each of the on-MOSFET and the off-MOSFET is a bidirectional MOSFET which allows a current to flow bidirectionally between the source and the drain when a gate receives an on signal.

19. The micro-power source module according to claim 13, wherein the off-MOSFET or off-diode is a diode having a cathode that is connected to the high-potential-side output terminal of the power source IC and an anode that is connected to the ground terminal of the power source IC.

* * * * *